US012015947B2

(12) United States Patent
Vitthaladevuni et al.

(10) Patent No.: US 12,015,947 B2
(45) Date of Patent: Jun. 18, 2024

(54) GENERALIZED NEURAL NETWORK ARCHITECTURES BASED ON FREQUENCY AND/OR TIME DIVISION

(71) Applicant: QUALCOMM Incorporated, San Diego, CA (US)

(72) Inventors: Pavan Kumar Vitthaladevuni, San Diego, CA (US); Taesang Yoo, San Diego, CA (US); Naga Bhushan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 407 days.

(21) Appl. No.: 17/365,510

(22) Filed: Jul. 1, 2021

(65) Prior Publication Data
US 2023/0007530 A1    Jan. 5, 2023

(51) Int. Cl.
*H03M 7/34* (2006.01)
*G06N 20/20* (2019.01)
*H03M 7/30* (2006.01)
*H04W 24/10* (2009.01)
*H04W 28/06* (2009.01)

(52) U.S. Cl.
CPC ............ *H04W 28/06* (2013.01); *G06N 20/20* (2019.01); *H03M 7/6011* (2013.01); *H04W 24/10* (2013.01); *H03M 7/3059* (2013.01)

(58) Field of Classification Search
CPC ...... H04W 28/06; H04W 24/10; G06N 20/20; G06N 3/045; H03M 7/6011; H03M 7/3059; H04B 7/04

USPC .......................................................... 341/51, 50
See application file for complete search history.

(56) References Cited

U.S. PATENT DOCUMENTS

| 2018/0314985 | A1* | 11/2018 | O'Shea | H04B 17/30 |
| 2020/0293497 | A1* | 9/2020 | Wu | G06N 3/045 |
| 2020/0304802 | A1* | 9/2020 | Habibian | G06N 3/044 |

FOREIGN PATENT DOCUMENTS

WO    2020180221 A1    9/2020

OTHER PUBLICATIONS

International Search Report and Written Opinion—PCT/US2022/072961—ISA/EPO—Oct. 6, 2022.

(Continued)

*Primary Examiner* — Jean B Jeanglaude
(74) *Attorney, Agent, or Firm* — Patterson + Sheridan, LLP

(57) ABSTRACT

Certain aspects of the present disclosure provide techniques for measurement encoding and decoding using neural networks to compress and decompress measurement data. One example method generally includes: generating, via each of a plurality of neural network encoders operating on measurement data, a compressed measurement based on a respective portion of the measurement data, wherein each of the neural network encoders is based on the same neural network model; generating at least one message indicative of the measurement data based on the compressed measurements; and transmitting the at least one message.

28 Claims, 15 Drawing Sheets

(56) References Cited

OTHER PUBLICATIONS

Li X., et al., "Spatio-Temporal Representation With Deep Neural Recurrent Network in MIMO CSI Feedback," IEEE Wireless Communications Letters, IEEE, Piscataway, NJ, USA, vol. 9, No. 5, Jan. 7, 2020, pp. 653-657, XP011787531, ISSN: 2162-2337, DOI: 10.1109/LWC.2020.2964550 [retrieved on May 7, 2020] figure 4, section III.A.
Liu Z., et al., "A Markovian Model-Driven Deep Learning Framework for Massive MIMO CSI Feedback," arXiv.org, Sep. 20, 2020, pp. 1-14, XP055957388, Ithaca, figure 6, section D, Equation 16.

\* cited by examiner

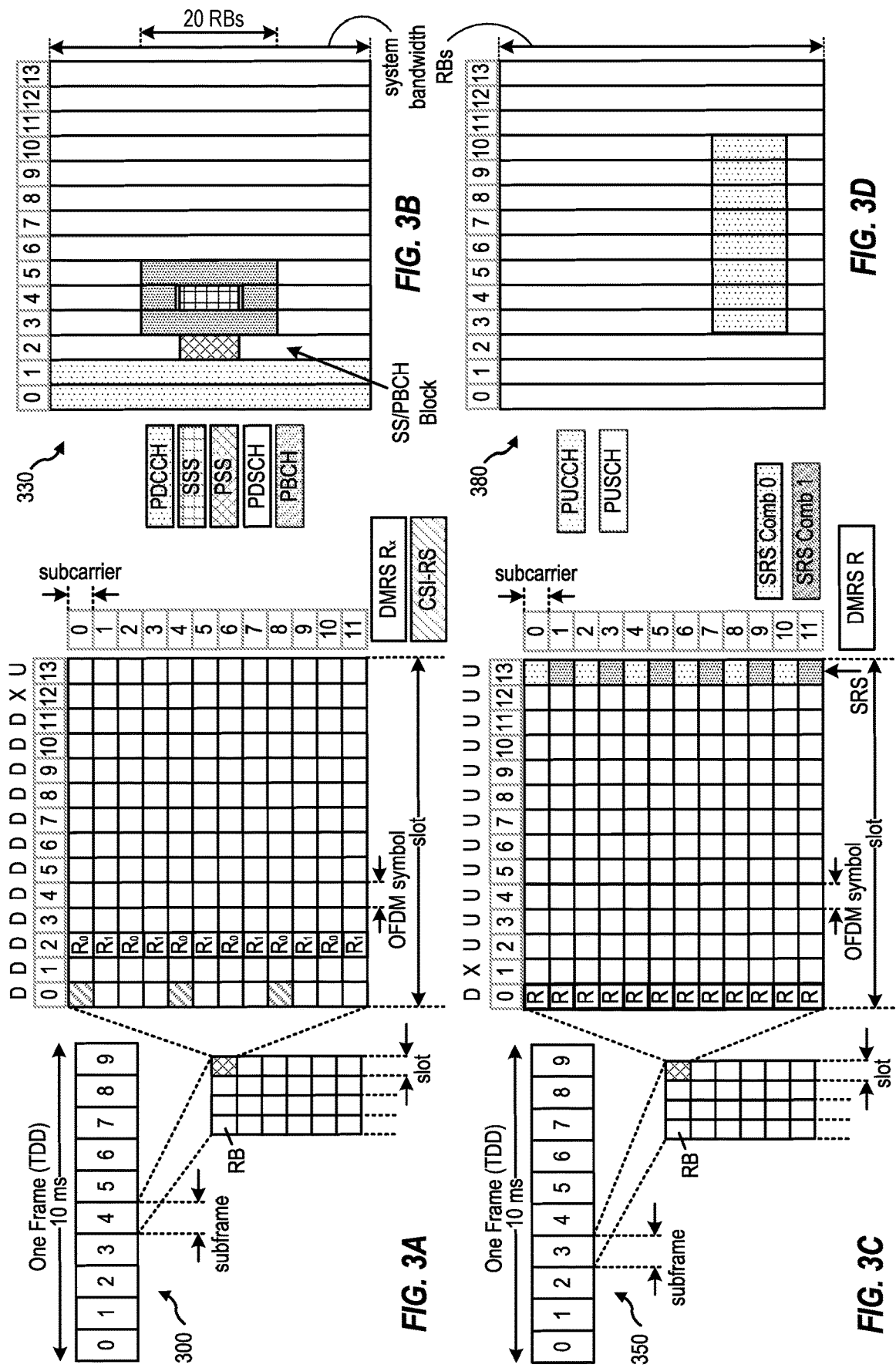

GENERALIZED NEURAL NETWORK ARCHITECTURES BASED ON FREQUENCY AND/OR TIME DIVISION

INTRODUCTION

Aspects of the present disclosure relate to wireless communications, and more particularly, to techniques for measurement encoding and decoding using neural networks to compress and decompress measurement data.

Wireless communication systems are widely deployed to provide various telecommunication services such as telephony, video, data, messaging, broadcasts, or other similar types of services. These wireless communication systems may employ multiple-access technologies capable of supporting communication with multiple users by sharing available system resources with those users (e.g., bandwidth, transmit power, or other resources). Multiple-access technologies can rely on any of code division, time division, frequency division orthogonal frequency division, single-carrier frequency division, or time division synchronous code division, to name a few. These and other multiple access technologies have been adopted in various telecommunication standards to provide a common protocol that enables different wireless devices to communicate on a municipal, national, regional, and even global level.

Although wireless communication systems have made great technological advancements over many years, challenges still exist. For example, complex and dynamic environments can still attenuate or block signals between wireless transmitters and wireless receivers, undermining various established wireless channel measuring and reporting mechanisms, which are used to manage and optimize the use of finite wireless channel resources. Consequently, there exists a need for further improvements in wireless communications systems to overcome various challenges.

SUMMARY

One aspect provides a method for wireless communication. The method generally includes: generating, via each of a plurality of neural network encoders operating on measurement data, a compressed measurement based on a respective portion of the measurement data, wherein each of the neural network encoders is based on the same neural network model; generating at least one message indicative of the measurement data based on the compressed measurements; and transmitting the at least one message.

One aspect provides a method for wireless communication. The method generally includes: receiving at least one message indicating compressed measurement data; generating, via each of a plurality of neural network decoders operating on the compressed measurement data, a decompressed measurement based on a respective portion of the compressed measurement data, wherein each of the neural network decoders is based on the same neural network model; and assessing channel characteristics based on the decompressed measurements.

Other aspects provide: an apparatus operable, configured, or otherwise adapted to perform the aforementioned methods as well as those described elsewhere herein; a non-transitory, computer-readable medium comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF THE DRAWINGS

The appended figures depict certain features of the various aspects described herein and are not to be considered limiting of the scope of this disclosure.

FIGS. 3A-3D depict various example aspects of data structures for a wireless communication network.

DETAILED DESCRIPTION

Aspects of the present disclosure provide apparatuses, methods, processing systems, and computer-readable media for measurement encoding and decoding using neural networks to compress and decompress measurement data. In next-generation wireless technologies, wireless nodes perform various measurements and report these measurements (e.g., provide measurement feedback) to facilitate efficient configuration of wireless communications. These feedback signals may consume a large amount of overhead, resulting in communication inefficiencies. Neural networks may be used to compress feedback signaling, reducing the overhead.

The feedback signaling that is compressed may be based on measurements made over various bands. Having different neural networks for different bands may be inefficient.

Certain aspects of the present disclosure are directed to techniques for implementing the same neural network model that can be implemented for compression of measurements performed on different bands. In some aspects, overhead may be further reduced by implementing differential encoding of compressed measurement data. For example, measurements performed across different frequencies, time intervals, or both, may be encoded using a differential encoding technique. The technique to be used for the encoding may be configured by a base station, in some aspects. The aspects described herein allow for reducing signaling overhead for reporting measurements across different bands using a common neural network model (also referred to as a "basic neural network block").

Introduction to Wireless Communication Networks

Figure 1:
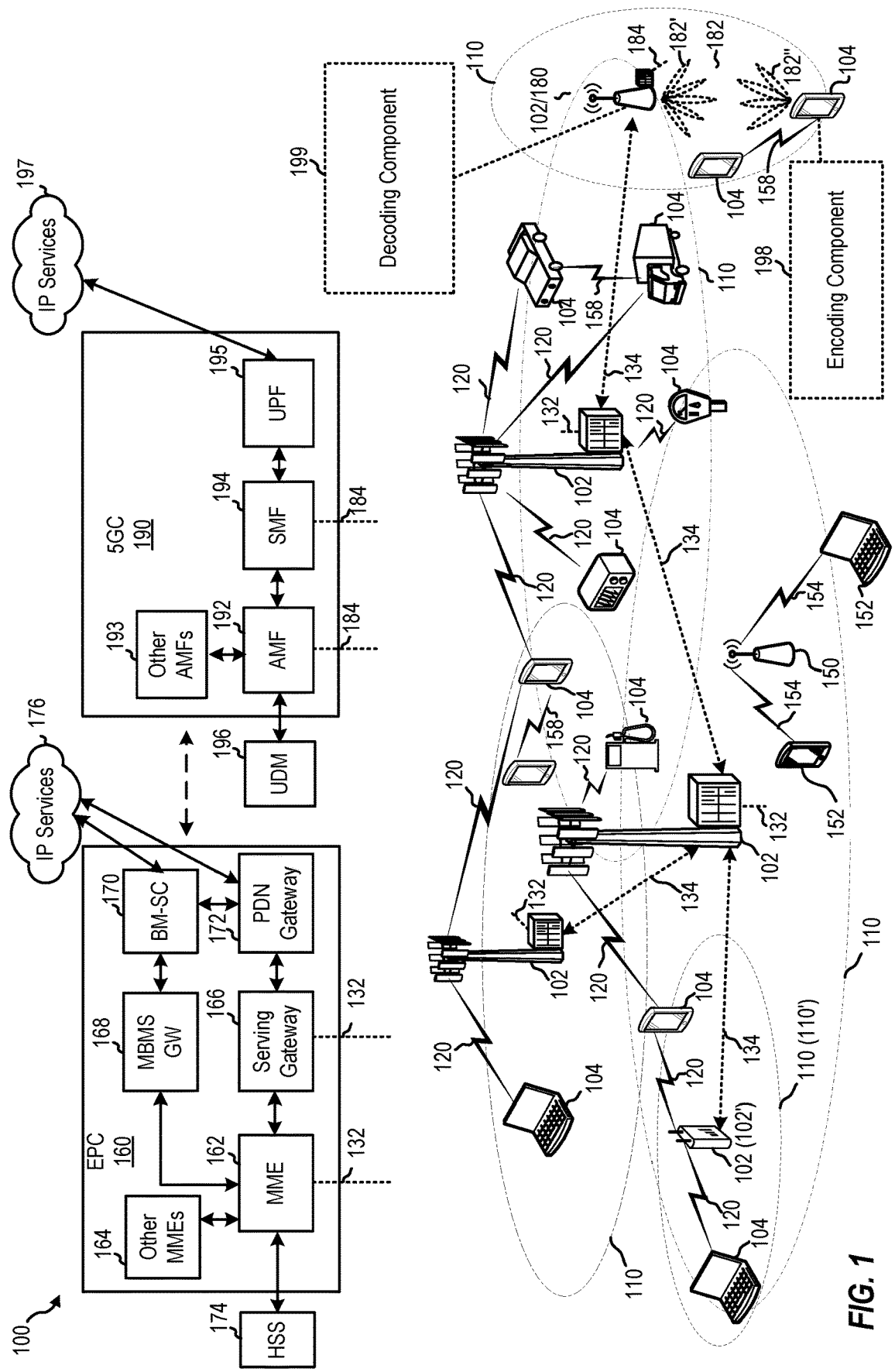
FIG. 1 is a block diagram conceptually illustrating an example wireless communication network.

FIG. 1 depicts an example of a wireless communications network 100, in which aspects described herein may be implemented.

Generally, wireless communications network 100 includes base stations (BSs) 102, user equipments (UEs) 104, one or more core networks, such as an Evolved Packet Core (EPC) 160 and fifth generation core (5GC) network 190, which interoperate to provide wireless communications services.

Base stations 102 may provide an access point to the EPC 160 and/or 5GC 190 for a user equipment 104, and may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, delivery of warning messages, among other functions. Base stations may include and/or be referred to as a NodeB, next generation NodeB (gNodeB or gNB), evolved Node B (eNB), next generation eNB (ng-eNB) (e.g., an eNB that has been enhanced to provide connection to both EPC 160 and 5GC 190), an access point, a base transceiver station, a radio base station, a radio transceiver, a transceiver function, or a transmission reception point in various contexts.

Base stations 102 wirelessly communicate with UEs 104 via communications links 120. Each of base stations 102 may provide communication coverage for a respective geographic coverage area 110, which may overlap in some cases. For example, small cell 102' (e.g., a low-power base station) may have a coverage area 110' that overlaps a portion of the coverage area 110 of one or more macrocells (e.g., high-power base stations).

The communication links 120 between base stations 102 and UEs 104 may include uplink (UL) (also referred to as "reverse link") transmissions from a user equipment 104 to a base station 102 and/or downlink (DL) (also referred to as "forward link") transmissions from a base station 102 to a user equipment 104. The communication links 120 may use multiple-input, multiple-output (MIMO) antenna technology, including spatial multiplexing, beamforming, and/or transmit diversity in various aspects.

Examples of UEs 104 include a cellular phone, a smartphone, a session initiation protocol (SIP) phone, a laptop, a personal digital assistant (PDA), a satellite radio, a global positioning system (GPS) device, a multimedia device, a video device, a digital audio player, a camera, a game console, a tablet, a smart device, a wearable device, a vehicle, an electric meter, a gas pump, a large or small kitchen appliance, a healthcare device, an implant, a sensor/actuator, a display, or other wireless devices. Some of UEs 104 may be Internet of things (IoT) devices (e.g., parking meter, gas pump, toaster, vehicles, heart monitor, or other IoT devices), always on (AON) devices, or edge processing devices. A UE 104 may also be referred to more generally as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, or a client.

Communications using higher frequency bands may have higher path loss and a shorter range compared to lower frequency communications. Accordingly, certain base stations (e.g., base station 180 in FIG. 1) may utilize beamforming 182 with a UE 104 to improve path loss and range. For example, base station 180 and UE 104 may each include a plurality of antennas, such as antenna elements, antenna panels, and/or antenna arrays to facilitate the beamforming.

In some cases, base station 180 may transmit a beamformed signal to UE 104 in one or more transmit directions 182'. UE 104 may receive the beamformed signal from the base station 180 in one or more receive directions 182". UE 104 may also transmit a beamformed signal to the base station 180 in one or more transmit directions 182". Base station 180 may also receive the beamformed signal from UE 104 in one or more receive directions 182'. Base station 180 and UE 104 may then perform beam training to determine the best receive and transmit directions for each of base station 180 and UE 104. Notably, the transmit and receive directions for base station 180 may or may not be the same. Similarly, the transmit and receive directions for UE 104 may or may not be the same.

Wireless communication network 100 (and more particularly, a base station 102) includes a decoding component 199, which may be configured to perform decompression of measurement data using a neural network architecture based on frequency and/or time division. Wireless network 100 further (and more particularly, a UE 104) includes an encoding component 198, which may be configured to perform encoding of measurement data using a neural network architecture based on frequency and/or time division.

Figure 2:
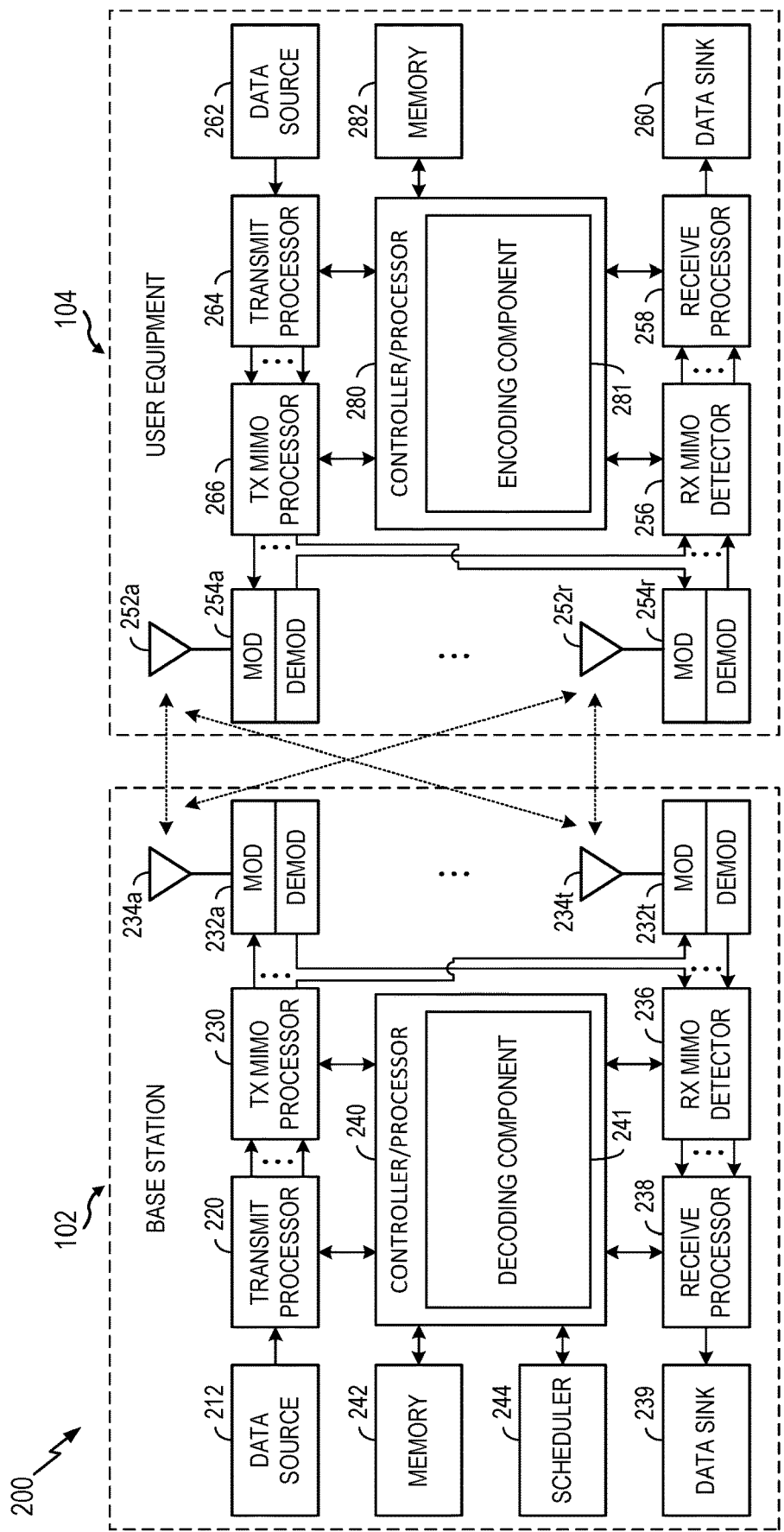
FIG. 2 is a block diagram conceptually illustrating aspects of an example a base station and user equipment.

FIG. 2 depicts aspects of an example base station (BS) 102 and a user equipment (UE) 104.

Generally, base station 102 includes various processors (e.g., 220, 230, 238, and 240), antennas 234a-t (collectively 234), transceivers 232a-t (collectively 232), which include modulators and demodulators, and other aspects, which enable wireless transmission of data (e.g., from data source 212) and wireless reception of data (e.g., to data sink 239). For example, base station 102 may send and receive data between itself and user equipment 104.

Base station 102 includes controller/processor 240, which may be configured to implement various functions related to wireless communications. In the depicted example, controller/processor 240 includes a decoding component 241, which may be representative of the decoding component 199 of FIG. 1. Notably, while depicted as an aspect of controller/processor 240, decoding component 241 may be implemented additionally or alternatively in various other aspects of base station 102 in other implementations.

Generally, user equipment 104 includes various processors (e.g., 258, 264, 266, and 280), antennas 252a-r (collectively 252), transceivers 254a-r (collectively 254), which include modulators and demodulators, and other aspects, which enable wireless transmission of data (e.g., from data source 262) and wireless reception of data (e.g., to data sink 260).

User equipment 104 includes controller/processor 280, which may be configured to implement various functions related to wireless communications. In the depicted example, controller/processor 280 includes an encoding component 281, which may be representative of encoding component 198 of FIG. 1. Notably, while depicted as an aspect of controller/processor 280, an encoding component 281 may be implemented additionally or alternatively in various other aspects of user equipment 104 in other implementations.

FIGS. 3A-3D depict aspects of data structures for a wireless communication network, such as wireless communication network 100 of FIG. 1. In particular, FIG. 3A is a diagram 300 illustrating an example of a first subframe within a 5G (e.g., 5G NR) frame structure, FIG. 3B is a diagram 330 illustrating an example of DL channels within a 5G subframe, FIG. 3C is a diagram 350 illustrating an example of a second subframe within a 5G frame structure, and FIG. 3D is a diagram 380 illustrating an example of UL channels within a 5G subframe.

Further discussions regarding FIG. 1, FIG. 2, and FIGS. 3A-3D are provided later in this disclosure.

Introduction to Neural Networks, Deep Neural Networks, and Deep Learning

Neural networks are organized into layers of interconnected nodes. Generally, a node (or neuron) is where computation happens. For example, a node may combine input data with a set of weights (or coefficients) that either amplifies or dampens the input data. The amplification or dampening of the input signals may thus be considered an assignment of relative significances to various inputs with regard to a task the network is trying to learn. Generally, input-weight products are summed (or accumulated), and then the sum is passed through a node's activation function to determine whether and to what extent that signal should progress further through the network.

In a most basic implementation, a neural network may have an input layer, a hidden layer, and an output layer. "Deep" neural networks generally have more than one hidden layer.

Deep learning is a method of training deep neural networks. Generally, deep learning maps inputs to the network to outputs from the network and is thus sometimes referred to as a "universal approximator" because the network can learn to approximate an unknown function $f(x)=y$ between any input x and any output y. In other words, deep learning finds the right $f$ to transform x into y.

More particularly, deep learning trains each layer of nodes based on a distinct set of features, which is the output from the previous layer. Thus, with each successive layer of a deep neural network, features become more complex. Deep learning is thus powerful because the network can progressively extract higher-level features from input data and perform complex tasks, such as object recognition, by learning to represent inputs at successively higher levels of abstraction in each layer, thereby building up a useful feature representation of the input data.

Aspects Related to Encoding and Decoding

Next-generation user equipments (UEs) (e.g., 5G UEs) perform various signal measurements and provide measurement reporting (e.g., feedback), allowing a base station (BS) to configure wireless communications. These measurements generate significant amounts of data to be transmitted to the BS. Some examples of the types of measurements that may be performed include per-antenna port measurements of channel and interference (e.g., for channel state feedback (CSF)), power measurements from serving and neighboring cells, inter-radio access technology (RAT) measurements such as measurements of signals from WiFi networks, and sensor measurements. Neural network models may be used to compress such measurements to reduce the overhead associated with feedback of measurements. For example, an autoencoder may be trained to allow for compression of measurements. The autoencoder may include an encoder for measurement compression, and a decoder for measurement decompression.

Some measurements may be performed over varying bandwidths. For example, a channel state information (CSI) report may be generated for a 20 MHz band in some cases, and for a 100 MHz band in some other cases. Having different neural networks for measurement compression for the 20 MHz band and the 100 MHz band may be inefficient. Certain aspects of the present disclosure are directed to an implementation for measurement compression using small bandwidth neural networks (also referred to as "basic neural network blocks") to compress measurements for a larger bandwidth. Wireless channels have a certain coherence bandwidth, due to which adjacent band channels may be correlated. Some aspects take advantage of this correlation between adjacent bands to create an architecture for measurement compression that can be applied for different bandwidths.

Certain aspects are directed to a generalization of measurement compression design. For instance, CSF compression may be implemented with a neural network for a small (e.g., or most common) bandwidth. The neural network may be reused for larger bandwidths that share the same numerology, such as the same carrier spacing. After performing iterative calls to the neural network to compress measurements over multiple bandwidths, the neural network outputs may be post-processed through an additional set of layers (e.g., a post-processing neural network) to harvest any correlation between the outputs.

Figure 4A:
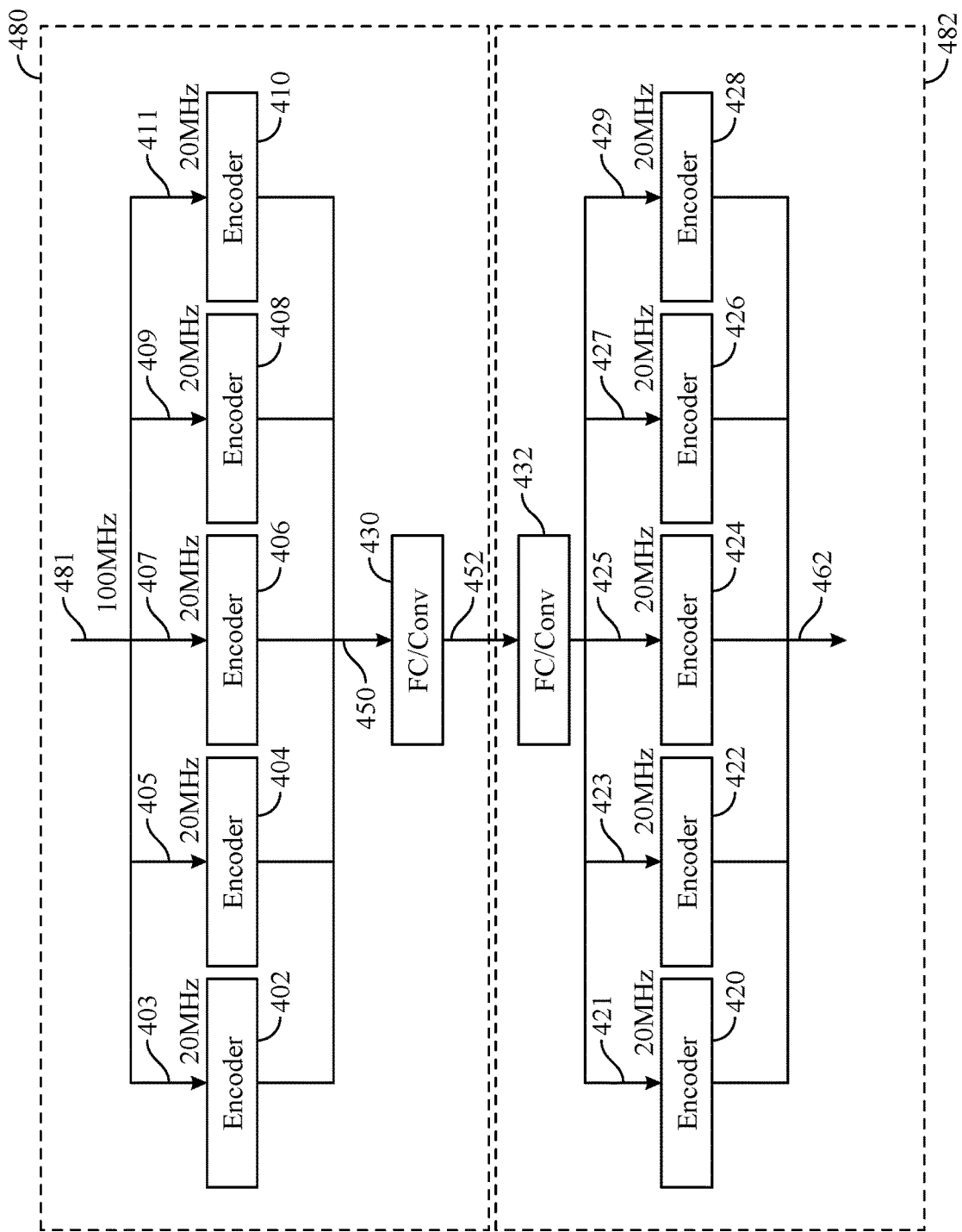
FIG. 4A illustrates an example autoencoder design that uses basic neural network blocks, in accordance with certain aspects of the present disclosure.

FIG. 4A illustrates an example autoencoder design, in accordance with certain aspects of the present disclosure. A wireless node 480 (e.g., also referred to herein as an "encoder device") may generate measurement data portions 403, 405, 407, 409, 411 (e.g., portions of measurement data 483) by performing a measurement on a bandwidth, such as a 100 MHz bandwidth. The measurement data 483 has dimensions (b,5,x,y). In other words, the measurement data 483 has a batch size of b and includes an x by y matrix for each of the five data portions 403, 405, 407, 409, 411. The measurement data portions 403, 405, 407, 409, 411 on each of 20 MHz subbands of the 100 MHz bandwidth may be provided to a respective encoder, such as encoders 402, 404, 406, 408, 410. For instance, a measurement may be performed on 270 resource blocks (RBs) spanning a band of 100 MHz. Thus, five measurement data portions, each on 55

RBs, may be provided to the encoders 402, 404, 406, 408, 410, respectively. Although the 100 MHz bandwidth is divided into five 20 MHz subbands here, it is to be understood that the same or a different bandwidth of interest may be divided into more or less than five subbands.

Each encoder generates a compressed version of a measurement (also referred to as a "compressed measurement") on a 20 MHz channel provided to the encoder. The compressed measurement 450 of the encoders 402, 404, 406, 408, 410 are then appended (or otherwise combined) and provided to a processing component 430 for post-processing. The processing component 430 may include a combination of fully connected and convolution layers. The compressed output 452 (also referred to herein as a "further compressed measurement") generated by the processing component 430 may be transmitted to a wireless node 482 (also referred to herein as a "decoder device").

The wireless node 482 may include a processing component 432 which may receive the compressed output 452, and perform decompression to generate measurements 421, 423, 425, 427, 429. For example, the measurements 421, 423, 425, 427, 429 may be an attempted reconstruction of the compressed measurements 450 input to the processing component 430. The measurements 421, 423, 425, 427, 429 are each provided to a respective one of decoders 420, 422, 424, 426, 428, as shown. Each of the measurements 421, 423, 425, 427, 429 represents a measurement on a 20 MHz subband, as shown. The measurements 421, 423, 425, 427, 429 are further decompressed by respective decoders 420, 422, 424, 426, 428 in an attempt to reconstruct the measurement data portions 403, 405, 407, 409, 411. Decoders 420, 422, 424, 426, 428 generate the measurement data 462.

Figure 4B:
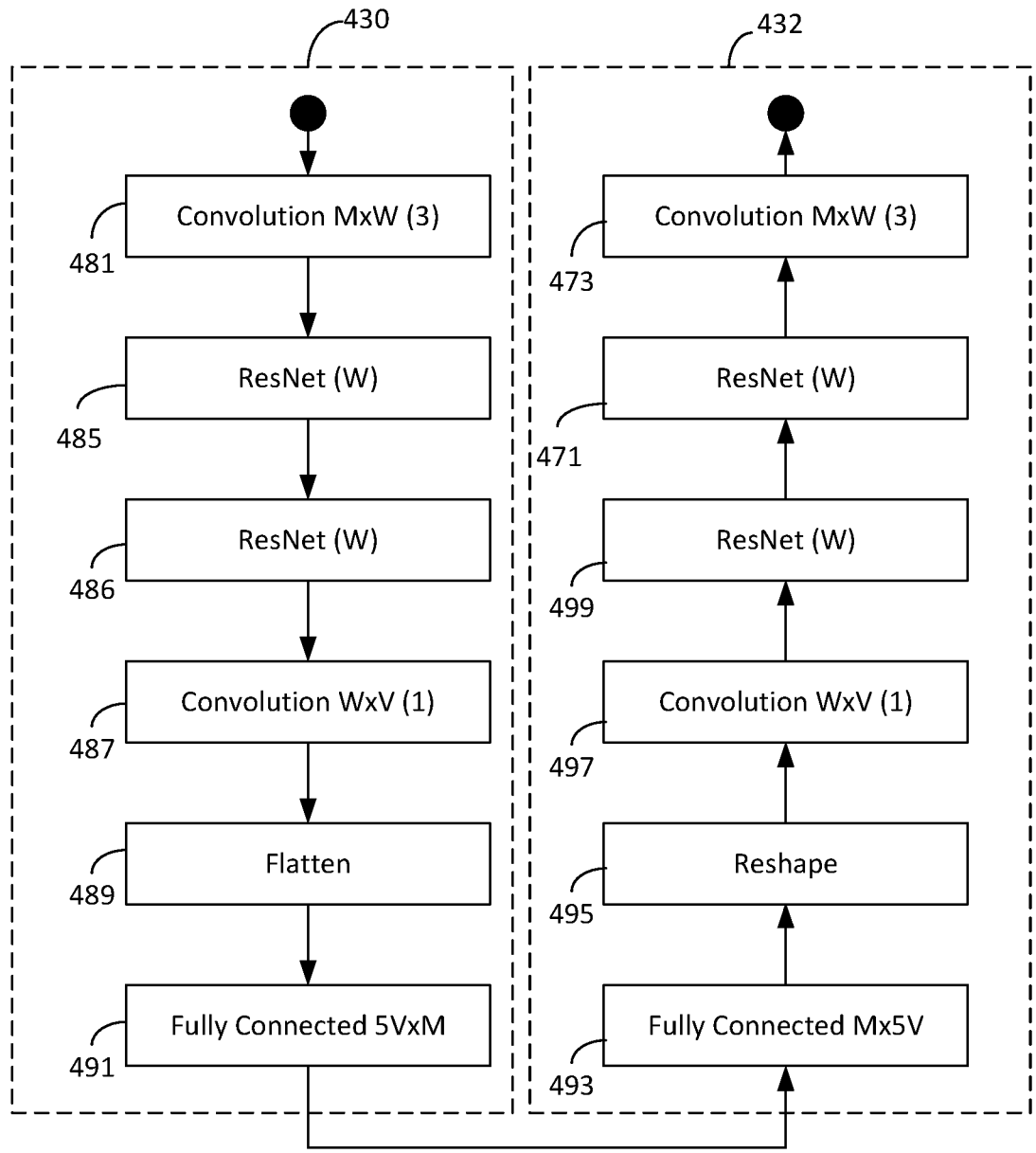
FIG. 4B illustrates example neural processing components for implementing encoder post-processing and decoder pre-processing in FIG. 4A, in accordance with certain aspects of the present disclosure.

FIG. 4B illustrates an example implementation of the processing components 430, 432, in accordance with certain aspects of the present disclosure. As described above, each of the processing components 430, 432 may include a combination of fully connected and convolution layers. The processing components 430 and 432 serve to further compress and decompress a data set using neural networks, respectively. This further compression or decompression may be based on any correlation between adjacent bands. The processing component 430 (e.g., an encoder device) may be configured to perform one or more operations on samples (e.g., data) to compress the samples. The processing component 432 (e.g., a decoder device) may be configured to decode the compressed samples to determine information, such as CSF.

The encoder device may receive an M×5 dimension data set. The encoder device may perform a spatial feature extraction, a short temporal (tap) feature extraction, and/or the like. In some aspects, this may be accomplished through the use of a 1-dimensional convolutional operation at block 481, that is fully connected in the spatial dimension (to extract the spatial feature) and simple convolution with a small kernel size in the tap dimension (to extract the short tap feature). Output of the 1-dimensional convolution operation may be a W×5 matrix.

At blocks 485, 486, the encoder device may perform one or more residual neural network (ResNet) operations. The one or more ResNet operations may further refine the spatial feature and/or the temporal feature. Output from the one or more ResNet operations may be a W×5 matrix.

At block 487, the encoder device may perform a W×V convolution operation on output from the one or more ResNet operations. The W×V convolution operation may include a pointwise (e.g., tap-wise) convolution operation. The W×V convolution operation may compress spatial features into a reduced dimension for each tap. The W×V convolution operation has an input of W features and an output of V features. Output from the W×V convolution operation may be a V×5 matrix.

At block 489, the encoder device may perform a flattening operation to flatten the V×5 matrix into a 5V element vector. At block 491, the encoder device may perform a 5 V×Dim fully connected operation to further compress the spatial-temporal feature data set into a low dimension vector of size Dim for transmission over the air to the decoder device.

At block 493, the decoder device may perform a Dim×5V fully connected operation to decompress the low dimension vector of size Dim into a spatial-temporal feature data set. At block 495, the decoder device may perform a reshaping operation to reshape the 5 Velement vector into a 2-dimensional V×5 matrix. At block 497, the decoder device may perform a V×W (with kernel of 1) convolution operation on output from the reshaping operation. The V×W convolution operation may include a pointwise (e.g., tap-wise) convolution operation. The V×W convolution operation may decompress spatial features from a reduced dimension for each tap. The V×W convolution operation has an input of V features and an output of W features. Output from the convolution operation may be a W×5 matrix.

At blocks 499, 471, the decoder device may perform one or more ResNet operations. The one or more ResNet operations may further decompress the spatial feature and/or the temporal feature. Output from the one or more ResNet operations may be a W×5 matrix.

At block 473, the decoder device may perform a spatial and temporal feature reconstruction. In some aspects, this may be accomplished through the use of a 1-dimensional convolutional operation that is fully connected in the spatial dimension (to reconstruct the spatial feature) and simple convolution with a small kernel size (e.g., 3) in the tap dimension (to reconstruct the short tap feature). Output from the convolution operation may be an M×5 matrix.

As indicated above, FIG. 4B is provided merely as an example. Other examples may differ from what is described with regard to FIG. 4B.

Aspects Related to Differential Encoding

Figure 5:
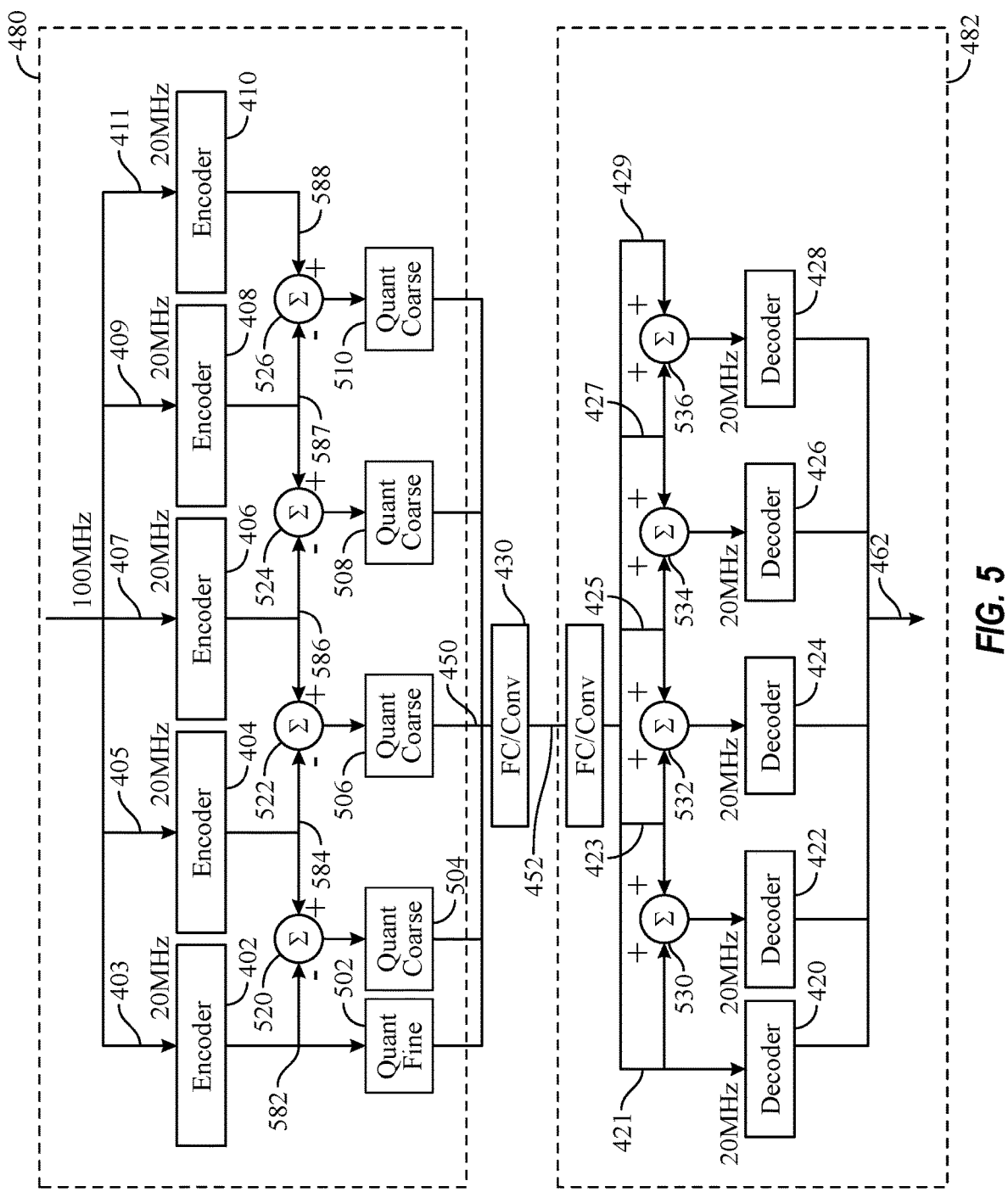
FIG. 5 illustrates an example autoencoder design that uses a differential encoding technique, in accordance with certain aspects of the present disclosure.

Certain aspects of the present disclosure are directed to techniques for performing differential encoding in the frequency domain, in the time domain, or a hybrid of both the time and frequency domains. FIG. 5 illustrates an example technique for differential decoding in the frequency domain.

FIG. 5 illustrates an example autoencoder design that uses a differential encoding technique, in accordance with certain aspects of the present disclosure. As shown, the output of the encoder 402 (e.g., compressed measurement 582) may be provided to a quantizer 502. The output of the encoder 402 and the output of the encoder 404 (e.g., compressed measurement 584) may be provided to a differential circuit 520 configured to generate a differential measurement based on a difference between the compressed measurements 584, 582 generated by encoders 404, 402, as shown. Similarly, the compressed measurement 584 generated by encoder 404 and the compressed measurement 586 generated by encoder 406 are provided to a differential circuit 522. The compressed measurement 586 generated by encoder 406 and the compressed measurement 587 generated by encoder 408 are provided to a differential circuit 524. The compressed measurement 587 generated by encoder 408 and the compressed measurement 588 generated by the encoder 410 are provided to a differential circuit 526. The differential measurement generated by each of the differential circuits 520, 522, 524, 526 is provided to a respective one of quantizers 504, 506, 508, 510.

In some aspects, the quantizers 504, 506, 508, 510 that receive differential measurements may perform a more coarse quantization as compared to quantizer 502 which does not receive a differential measurement (e.g., rather directly receives the compressed measurement generated by encoder 402). In some aspects, the granularity associated with the quantizers 504, 506, 508, 510 may differ. For example, the quantizer 504 may perform a coarser quantization than quantizer 506, the quantizer 506 may perform a coarser quantization than quantizer 508, and the quantizer 508 may perform a coarser quantization than quantizer 510.

The wireless node 482 may also include differential circuits 530, 532, 534, 536. Differential circuit 530 may provide the sum of 20 MHz measurement 421 and 20 MHz measurement 423 to decoder 422. Differential circuit 532 may provide the sum of 20 MHz measurement 423 and 20 MHz measurement 425 to decoder 424. Differential circuit 534 may provide the sum of 20 MHz measurement 425 and 20 MHz measurement 427 to decoder 426. Differential circuit 536 may provide the sum of 20 MHz measurement 427 and 20 MHz measurement 429 to decoder 428. The output of each of the differential circuits 530, 532, 534, 536 may be referred to herein as a summation measurement.

Figure 6B:
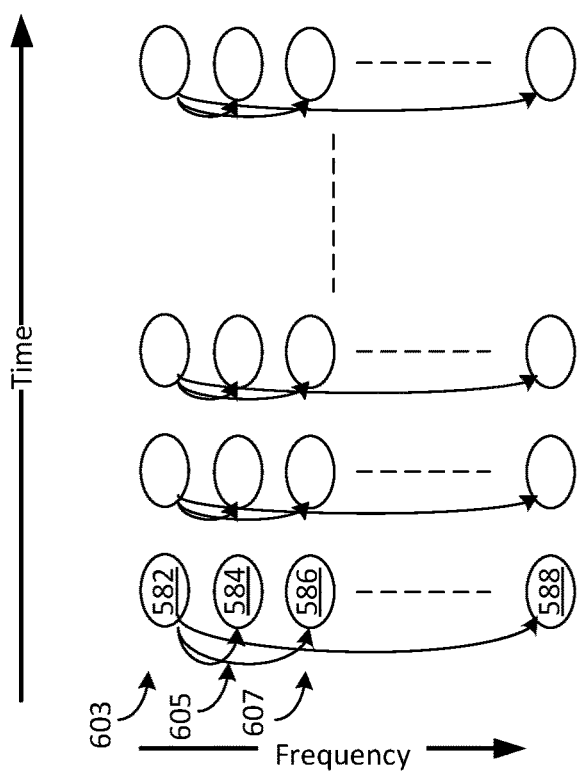
FIGS. 6A and 6B are diagrams showing differential encoding in the frequency domain, in accordance with certain aspects of the present disclosure.
Figure 6A:
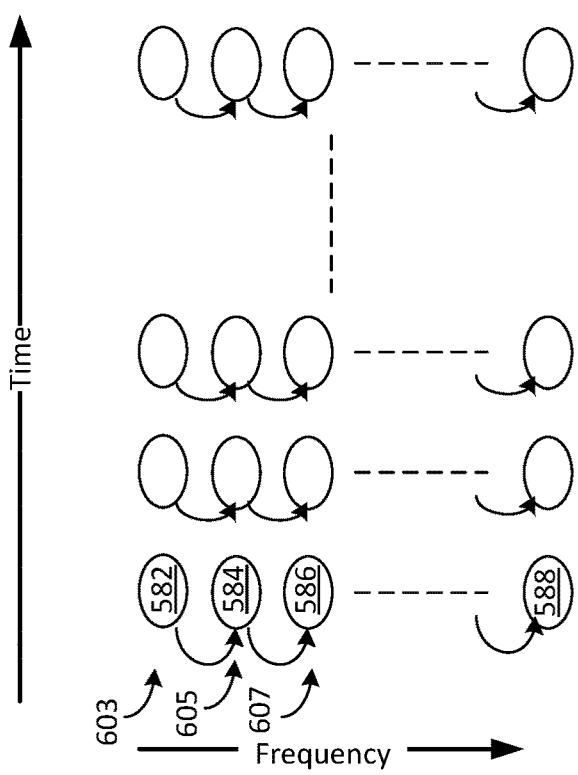

FIGS. 6A and 6B are diagrams showing differential encoding in the frequency domain, in accordance with certain aspects of the present disclosure. At each time stamp (e.g., time interval, as represented by a single column of bubbles), the measurement on each of the subbands may be encoded based on an adjacent or neighboring subband measurement. For example, as shown FIG. 6A, the measurement 584 for subband 605 may be represented as a differential measurement with respect to the measurement 582 for subband 603, the measurement 586 for subband 607 may be represented as a differential measurement with respect to the measurement 584 for subband 605, and so on.

The differential encoding technique described with respect to FIG. 6A corresponds to the differential encoding technique described with respect to FIG. 5. For example, the measurement generated by encoder 402 may correspond to the measurement 582 for subband 603, and the measurement generated by encoder 404 may correspond to the measurement 584 for subband 605. The differential circuit 520 provides a differential measurement representing a difference between the measurement 582 (e.g., the measurement at the output of encoder 402) for subband 603 and the measurement 584 (e.g., the measurement at the output of encoder 404) for subband 605.

In some aspects, at each time stamp, the subbands are encoded based on a fixed subband reference. A subband reference (or time reference) generally refers to a subband (or time interval) for which at least one measurement is not differentially encoded and from which other differentially encoded measurements are determined. For example, as shown in FIG. 6B, the subband 603 in each time interval may be the subband reference for that particular time interval. The measurement 584 for subband 605 may be represented as a differential measurement with respect to the measurement 582 for subband 603, the measurement 586 for subband 607 may be represented as a differential measurement with respect to the measurement 582 for subband 603, and so on.

The aspects described with respect to FIG. 4A for frequency-domain differential encoding may be applicable to performing time-domain differential encoding. For example, referring back to FIG. 4A, instead of each of the measurements provided to the encoders 402, 404, 406, 408, 410 being associated with measurements on different bands (e.g., different 20 MHz bands), the measurements may be associated with measurements on different time intervals.

Figure 7B:
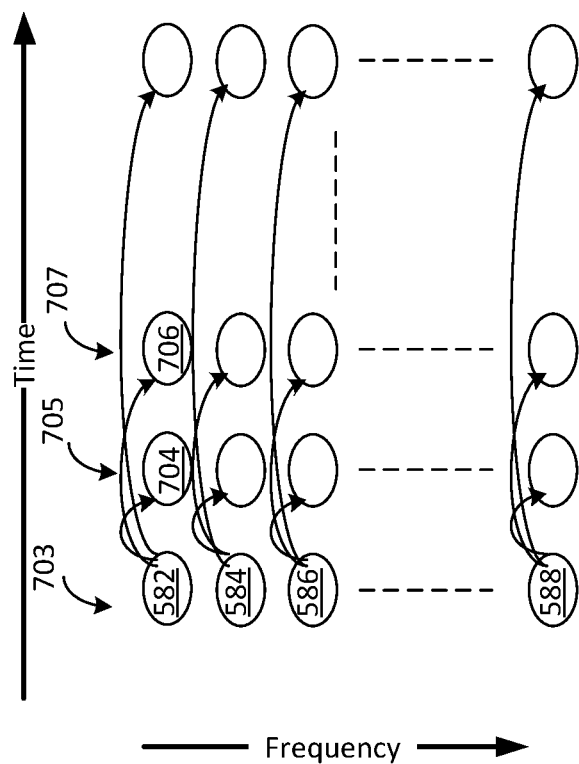
FIGS. 7A and 7B illustrate example techniques for differential encoding in the time domain, in accordance with certain aspects of the present disclosure.
Figure 7A:
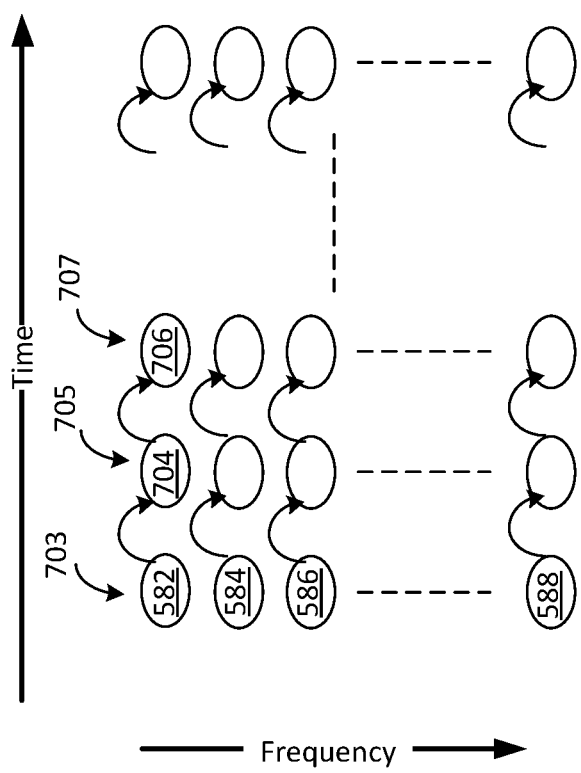

FIGS. 7A and 7B illustrate example techniques for differential encoding in the time domain, in accordance with certain aspects of the present disclosure. For each subband, the measurement at each time interval may be encoded based on a previous time interval measurement. For example, as shown FIG. 7A, the measurement 704 for interval 705 may be represented as a differential measurement with respect to the measurement 582 for interval 703, the measurement 706 during interval 707 may be represented as a differential measurement with respect to the measurement 704 during interval 705, and so on.

In some aspects, for each subband, the measurement at each time interval may be encoded based on a fixed time interval reference. For example, as shown in FIG. 7B, the time interval 703 may be the time interval reference. Thus, the measurement 704 for interval 705 may be represented as a differential measurement with respect to the measurement 582 for interval 703, the measurement 706 for interval 707 may be represented as a differential measurement with respect to the measurement 582 for interval 703, and so on.

Figure 8B:
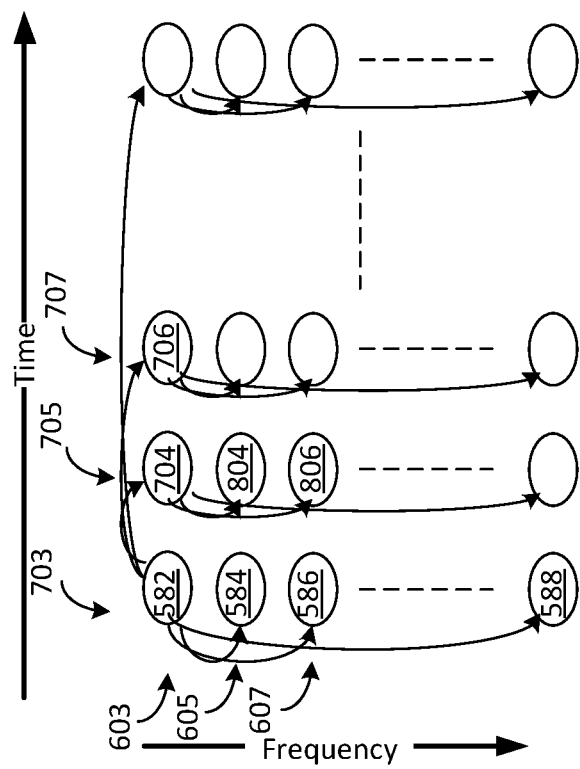
FIGS. 8A, 8B, 9A, and 9B illustrate example techniques for differential encoding in the frequency and time domains, in accordance with certain aspects of the present disclosure.
Figure 8A:
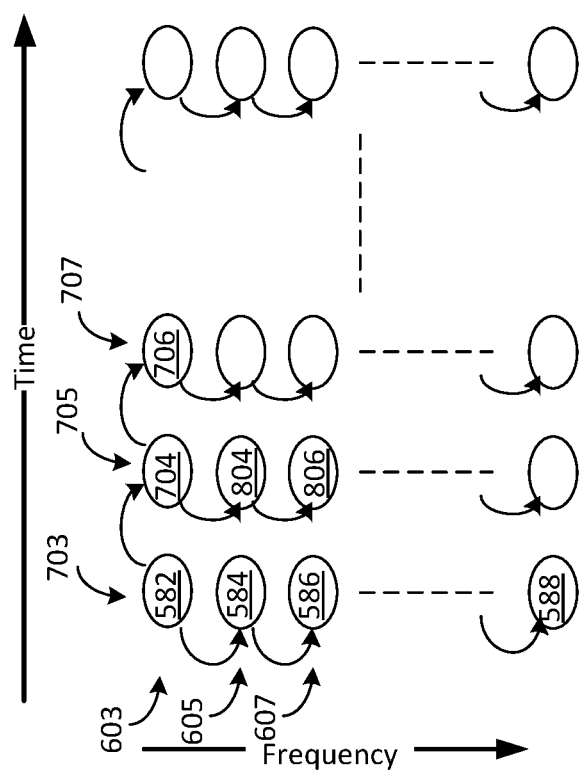

FIGS. 8A, 8B, 9A, and 9B illustrate example techniques for differential encoding in the frequency and time domains (which may be referred to as "hybrid differential encoding"), in accordance with certain aspects of the present disclosure. As shown in FIG. 8A, some measurements may be encoded using differential encoding in the time domain, while other measurements may be encoded using differential encoding in the frequency domain. As shown, measurements 584, 586, 804, 806 may be differentially encoded in the frequency domain. That is, the measurement 584 for subband 605 may be represented as a differential measurement with respect to the measurement 582 for subband 603, the measurement 586 for subband 607 may be represented as a differential measurement with respect to the measurement 584 for subband 605, and so on. Similarly, the measurement 804 for subband 605 may be represented as a differential measurement with respect to the measurement 704 for subband 603, the measurement 806 for subband 607 may be represented as a differential measurement with respect to the measurement 804 for subband 605, and so on.

Other measurements in FIG. 8A may be encoded using differential encoding in the time domain. For example, the measurement 704 for interval 705 may be represented as a differential measurement with respect to the measurement 582 for interval 703, the measurement 706 for interval 707 may be represented as a differential measurement with respect to the measurement 704 for interval 705, and so on.

In other words, a measurement $X(t,f)$ during interval t and on subband f may be differentially encoded based on a measurement $X(t,f-1)$ during interval t and on a lower subband (f−1), whereas a measurement $X(t,0)$ during interval t on a reference subband 0 (e.g., subband 603) is encoded based on a measurement $X(t-1,0)$ during a previous interval t−1 and on subband 0.

As shown in FIG. 8B, a measurement $X(t,f)$ during interval t and on subband f may be differentially encoded based on a reference measurement $X(t,0)$ during time interval t and on the reference subband 0 (e.g., subband 603). The reference measurement $X(t,0)$ may be differentially encoded based on a reference measurement $X(0,0)$ during a reference time interval 0 (e.g., time interval 703) and the reference subband 0 (e.g., subband 603).

In other words, for interval 703, the measurement 584 for subband 605 may be represented as a differential measurement with respect to the measurement 582 for subband 603, the measurement 586 for subband 607 may be represented as a differential measurement with respect to the measurement 582 for subband 603, and so on. For interval 705, the measurement 804 for subband 605 may be represented as a differential measurement with respect to the measurement 704 for subband 603, the measurement 806 for subband 607 may be represented as a differential measurement with respect to the measurement 704 for subband 603, and so on. Moreover, the measurement 704 for interval 705 may be represented as a differential measurement with respect to the measurement 582 during interval 703, the measurement 706 for interval 707 may be represented as a differential measurement with respect to the measurement 582 during interval 703, and so on.

Figure 9B:
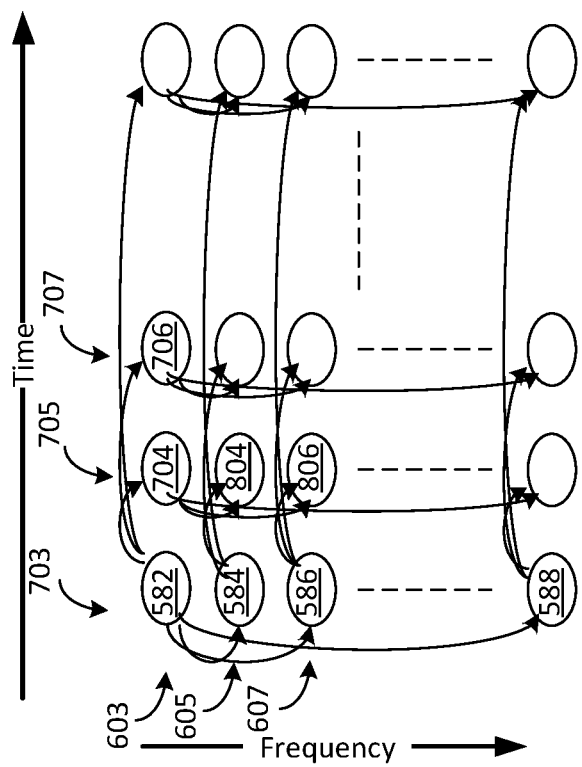
Figure 9A:
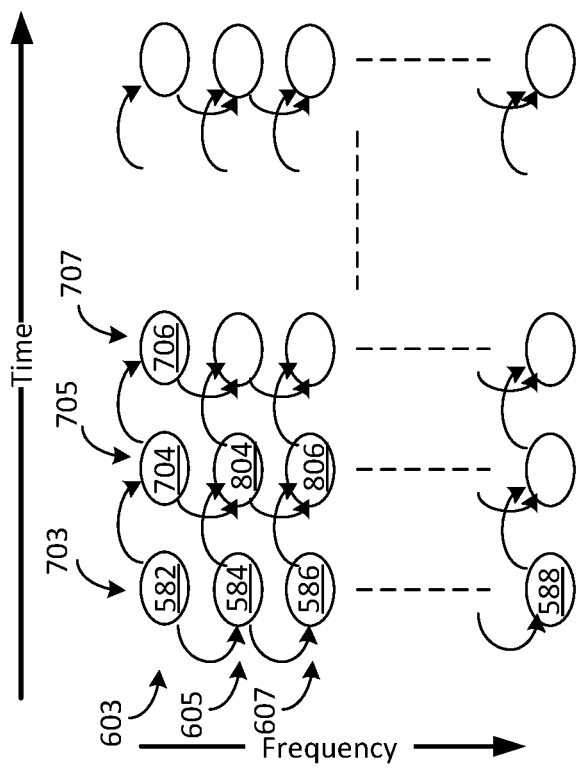

As shown in FIG. 9A, a measurement $X(t,f)$ may be differentially encoded based on a function of $X(t-1,f)$ and $X(t,f-1)$, which may ultimately be differentially encoded based on reference measurement $X(0,0)$. For example, the measurement 804 may be differentially encoded based on a function of measurement 584 and of measurement 704. Similarly, the measurement 806 may be differentially encoded based on a function of measurement 804 and measurement 586. Measurements (e.g., measurement 704) for a reference subband (e.g., subband 603) may be differentially encoded based on a measurement for a previous interval (e.g., measurement 582). Measurements (e.g., measurement 584) for a reference interval (e.g., interval 703) may be differentially encoded based on a measurement (e.g., measurement 582) for a lower subband (e.g., subband 603).

As shown in FIG. 9B, a measurement $X(t,f)$ may be differentially encoded based on a function of $X(t,0)$ and $X(0,f)$, which in turn are differentially encoded based on reference measurement $X(0,0)$. For example, the measurement 804 for interval 705 and subband 605 may be differentially encoded based on measurement 704 and measurement 584, and the measurement 806 for interval 705 and subband 607 may be differentially encoded based on measurement 704 and measurement 586.

Performing differential encoding in time may provide a higher overhead gain (e.g., more compression) as compared to performing differential encoding in frequency, depending on the amount of Doppler shift. With higher Doppler shift, performing differential encoding in the frequency domain may provide better channel state feedback results. For example, where there is a strong line of sight (LOS) component between the transmitter and the receiver, using differential encoding in the frequency domain may provide better channel state feedback results as compared to using differential encoding in the time domain.

Figure 10:
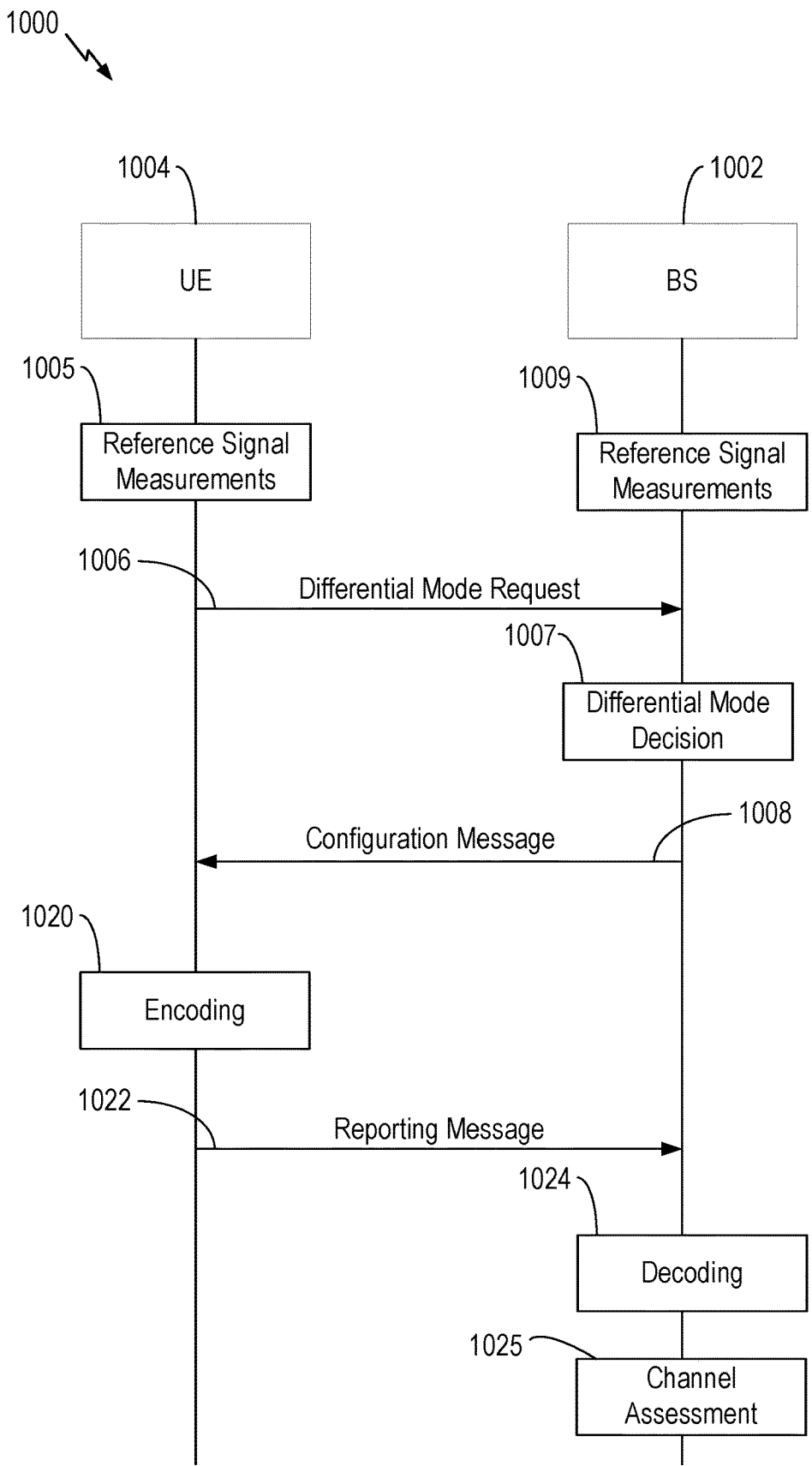
FIG. 10 is a call flow diagram illustrating example operations for differential encoding, in accordance with certain aspects of the present disclosure.

FIG. 10 is a call flow diagram illustrating example operations 1000 for differential encoding, in accordance with certain aspects of the present disclosure. Based on reference signal (RS) measurements 1005 performed at the UE 1004, the UE 1004 may decide that overhead gains are possible through differential encoding, in the time or frequency domains. In response, the UE 1004 may send a request message 1006 to the BS 1002, requesting that the UE be configured in the differential mode, in either the time or frequency domain (or both). At block 1007, the BS 1002 may decide whether to configure differential mode encoding at the UE. In some aspects, the BS may independently make the decision at block 1007 based on UL RS measurements 1009. In other aspects, the BS may take the UE's request message 1006 into account when deciding whether to configure the UE with differential mode encoding and whether to implement frequency domain, time domain, or hybrid differential encoding.

Upon making the decision at block 1007, the BS 1002 may send a configuration message 1008 to the UE 1004, the configuration message 1008 indicating whether to use differential encoding. In some aspects, if the BS 1002 decides to configure the UE in the differential encoding mode in the frequency domain, the BS may also indicate (e.g., via configuration message 1008) the size of each subband (e.g., the size of each of subbands 603, 605, 607), the granularity of encoding the differential subbands (e.g., the granularity associated with quantizers 504, 506, 508, 510), along with the granularity of the non-differential subband (e.g., the granularity associated with quantizer 502).

The BS may also configure the UE with which subband (e.g., subband 603) to report fully (e.g., non-differentially). The BS may also indicate which subbands to report differentially (e.g., subbands 605, 607), and the reference (e.g., measurement 582) for the differential encoding (e.g., in the time and/or frequency domain). For example, referring to FIG. 6B, the BS may indicate that subband 603 is the reference subband for performing differential encoding of measurements 584, 586 on subbands 605, 607, respectively. For example, referring back to FIG. 7A, the BS may configure the UE to report the measurements performed during interval 703 at time t0 using non-differential encoding, and report measurements (e.g., measurements 704, 706) for future intervals (e.g., intervals 705, 707 at times t1 and t2) on a differential basis.

In some aspects, the BS may indicate the function to be used for hybrid differential encodings. For instance, as described with respect to FIGS. 9A and 9B, a measurement (e.g., measurement 804) may be differentially encoded based on a function of other measurements (e.g., measurements 584, 704). For example, the function may be:

$$(\alpha \times M1) + (\beta \times M2)$$

where $\alpha$ and $\beta$ are constants, M1 is a first measurement (e.g., measurement 584), and M2 is a second measurement (e.g., measurement 704). As an example, a and may each be set to 0.5 to provide an equal weight for measurement M1 or M2, or a may be set to a higher value than to provide greater weight for measurement M1 as compared to measurement M2.

At block 1020, the UE 1004 may perform encoding of measurements in accordance with the configuration message 1008. For example, the UE may perform the encoding using the techniques described with respect to FIGS. 4A, 4B, 5, 6A, 6B, 7A, 7B, 8A, 8B, 9A, and 9B. The UE 1004 may then transmit a reporting message 1022 including, or at least indicating, the encoded measurements. The BS may receive the encoded measurements and perform decoding at block 1024, to decompress and generate measurement data. The measurement data may be used for performing channel assessment at block 1025.

Figure 11:
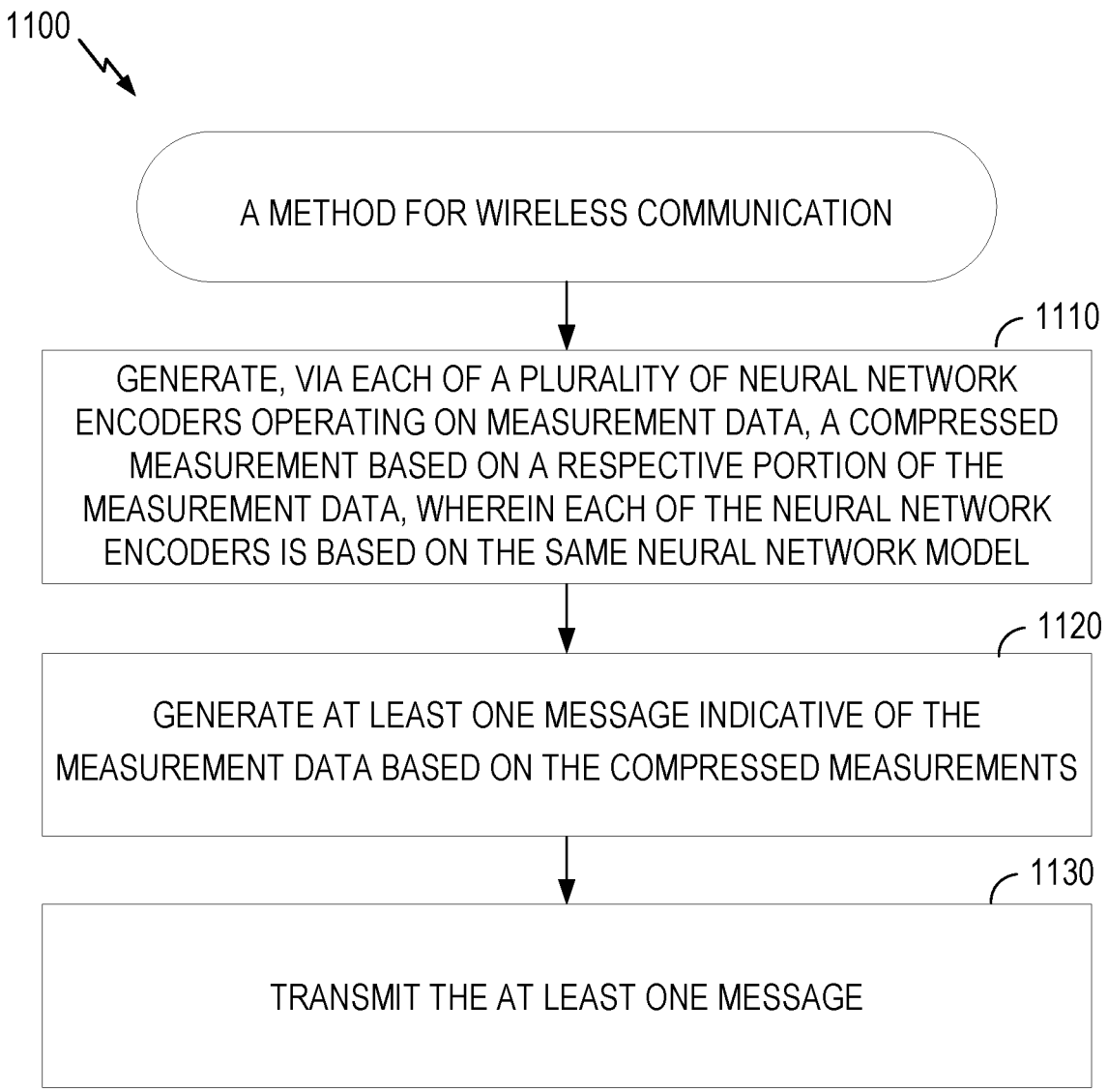
FIG. 11 is a flow diagram illustrating example operations for wireless communication by a decoder device, in accordance with certain aspects of the present disclosure.

FIG. 11 is a flow diagram illustrating example operations 1100 for wireless communication, in accordance with certain aspects of the present disclosure. The operations 1100 may be performed, for example, by a wireless node such as a UE (e.g., a UE 104 in the wireless communication network 100 of FIG. 1) or any other child node.

Operations 1100 may be implemented as software components that are executed and run on one or more processors (e.g., controller/processor 280 of FIG. 2). Further, the transmission and reception of signals by the UE in operations 1100 may be enabled, for example, by one or more antennas (e.g., antennas 252 of FIG. 2). In certain aspects, the transmission and/or reception of signals by the UE may be implemented via a bus interface of one or more processors (e.g., controller/processor 280 or encoding component 281 of FIG. 2) obtaining and/or outputting signals.

The operations 1100 begin, at block 1110, with the wireless node generating, via each of a plurality of neural network encoders (e.g., encoders 402, 404, 406, 408, 410) operating on measurement data (e.g., respective measurement data portions 403, 405, 407, 409, 411), a compressed measurement based on a respective portion of the measurement data. In some aspects, each of the neural network encoders may be based on the same neural network model (e.g., a basic neural network block, which may be used to process measurements for a particular subband).

In some aspects, the measurement data is generated using measurements performed for a bandwidth (e.g., 100 MHz). The portion of the measurement data may be associated with a subband (e.g., 20 MHz) of the bandwidth.

At block 1120, the wireless node may generate at least one message (e.g., reporting message 1022, or compressed output 452) indicative of the measurement data based on the compressed measurements.

At block 1130, the wireless node may transmit the at least one message.

In some aspects, the compressed measurements may include a first compressed measurement (e.g., compressed measurement 582) and a second compressed measurement (e.g., compressed measurement 584). The wireless node may generate a first differential measurement (e.g., via differential circuit 520) to represent the second compressed measurement, the first differential measurement being generated based on a difference between the first compressed measurement and the second compressed measurement. The at least one message may be generated based on the first compressed measurement and the first differential measurement.

In some aspects, frequency-domain differential encoding may be implemented. For example, the first compressed measurement and the second compressed measurement may be generated based on measurements performed on different subbands (e.g., subbands 603, 605, 607).

In some aspects, time-domain differential encoding may be implemented, as described with respect to FIGS. 7A and 7B. For example, the first compressed measurement (e.g., compressed measurement 582) and the second compressed measurement (e.g., compressed measurement 704) may be generated based on measurements performed at different intervals (e.g., intervals 703, 705, 707).

In some aspects, differential encoding may be implemented in the time and frequency domains, as described with respect to FIGS. 8A and 8B. For example, the compressed measurements may further include a third compressed measurement (e.g., compressed measurement 584). The wireless node may generate a second differential measurement to represent the third compressed measurement, the second differential measurement being generated based on a difference between the first compressed measurement and the third compressed measurement. The first compressed measurement and the third compressed measurement may be generated based on measurements performed on different subbands (e.g., subbands 603, 605). The at least one message may be generated based on the first compressed measurement, the first differential measurement, and the second differential measurement.

In some aspects, differential encoding may be performed a function of multiple measurements, as described with respect to FIGS. 9A and 9B. For example, the compressed measurements may also include a fourth compressed measurement (e.g., compressed measurement 804). The wireless node may generate a third differential measurement for the fourth compressed measurement, the third differential measurement being generated as a function of the first differential measurement and the second differential measurement. The at least one message may be generated based on the first compressed measurement, the first differential measurement, the second differential measurement, and the third differential measurement. In some aspects, the wireless node may receive (e.g., from a base station) an indication of the function.

In some aspects, differential encoding may be based on a fixed interval reference (e.g., measurement 582, 704, or 706) or a fixed subband reference (e.g., measurement 582, 584, or 586). For example, the compressed measurements may also include a third compressed measurement (e.g., compressed measurement 586). The wireless node may generate a second differential measurement for the third compressed measurement, the second differential measurement being generated based on a difference between the first compressed measurement (e.g., compressed measurement 582) and the third compressed measurement (e.g., compressed measurement 586). The at least one message may be generated based on the first compressed measurement, the first differential measurement, and the second differential measurement.

In some aspects, differential encoding may be based on previous time instance or adjacent (e.g., lower) subband. For example, the compressed measurements may further include a third compressed measurement (e.g., compressed measurement 586). The wireless node may generate a second differential measurement for the third compressed measurement, the second differential measurement (e.g., compressed measurement 584) being generated based on a difference between the second compressed measurement (e.g., compressed measurement 584) and the third compressed measurement. The at least one message may be generated based on the first compressed measurement, the first differential measurement, and the second differential measurement.

In some aspects, the wireless node may quantize the first compressed measurement (e.g., compressed measurement 582) using a first granularity, and quantize the first differential measurement (e.g., generated by differential circuit 520) using a second granularity, the second granularity being coarser than the first granularity. The wireless node may receive (e.g., from a base station) an indication of the first granularity and/or the second granularity.

In some aspects, the wireless node may receive (e.g., from a base station) an indication of whether to perform differential encoding of the compressed measurement. The wireless node may receive an indication of whether to perform differential encoding of the compressed measurements across measurements in at least one of the time domain or the frequency domain.

In some aspects, the wireless node may process the compressed measurements via another neural network model (e.g., via processing component 430) to generate further compressed measurements. The at least one message may indicate the further compressed measurements.

Figure 12:
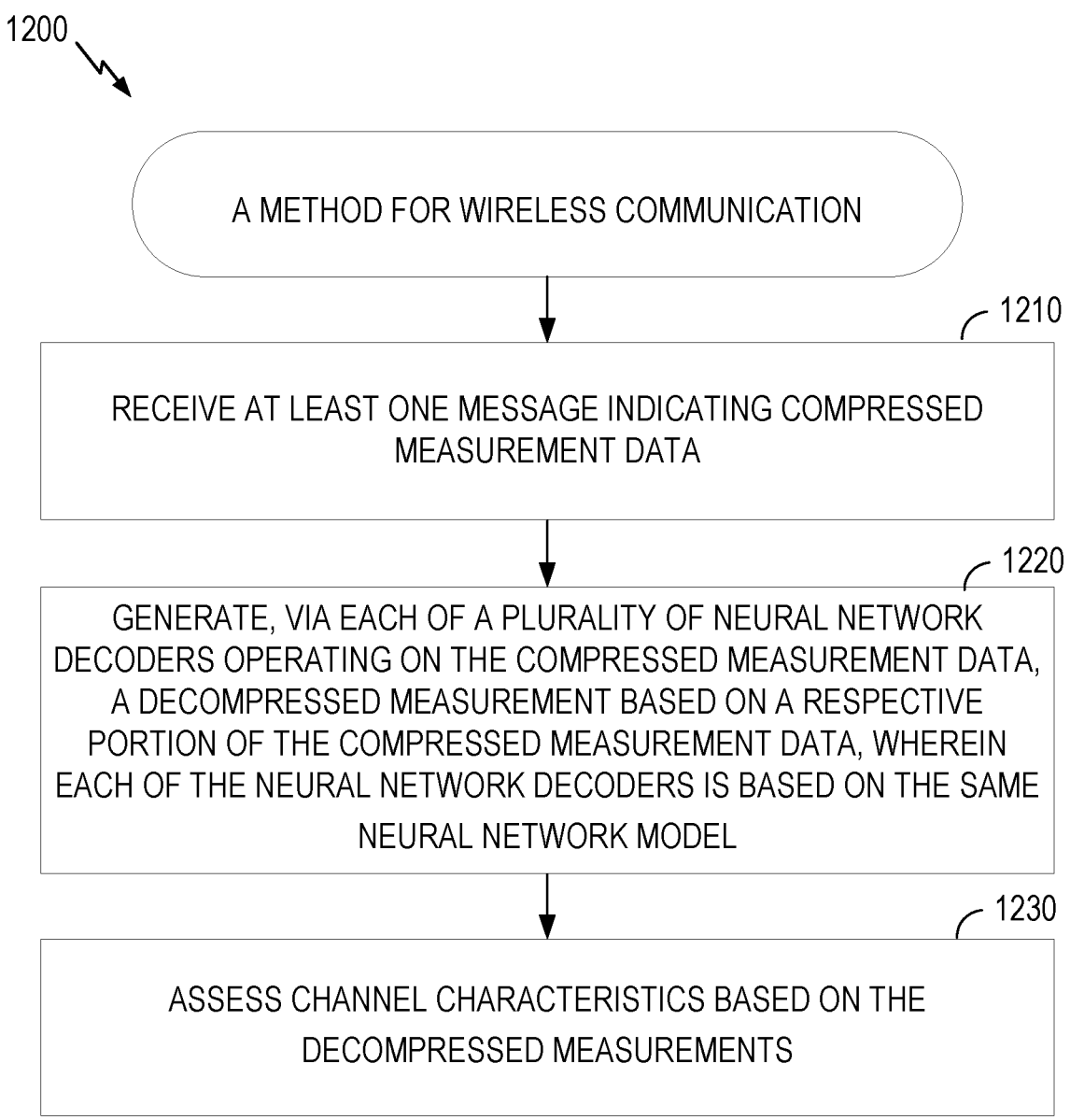
FIG. 12 is a flow diagram illustrating example operations for wireless communication by an encoder device, in accordance with certain aspects of the present disclosure.

FIG. 12 is a flow diagram illustrating example operations 1200 for wireless communication, in accordance with certain aspects of the present disclosure. The operations 1200 may be performed, for example, by a first wireless node, such as a BS (e.g., such as the BS 102 in the wireless communication network 100 of FIG. 1) or any other parent node.

Operations 1200 may be implemented as software components that are executed and run on one or more processors (e.g., controller/processor 240 of FIG. 2). Further, the transmission and reception of signals by the BS in operations 1200 may be enabled, for example, by one or more antennas (e.g., antennas 234 of FIG. 2). In certain aspects, the transmission and/or reception of signals by the BS may be implemented via a bus interface of one or more processors (e.g., controller/processor 240 or decoding component 241 of FIG. 2) obtaining and/or outputting signals.

The operations 1200 begin, at block 1210, with the wireless node receiving at least one message indicating compressed measurement data. At block 1220, the wireless node generates, via each of a plurality of neural network decoders (e.g., decoders 420, 422, 424, 426, 428) operating on the compressed measurement data, a decompressed measurement based on a respective portion of the compressed measurement data. Each of the neural network encoders may be based on the same neural network model. At block 1230, the wireless node assesses channel characteristics based on the decompressed measurements.

Example Wireless Communications Devices

Figure 13:
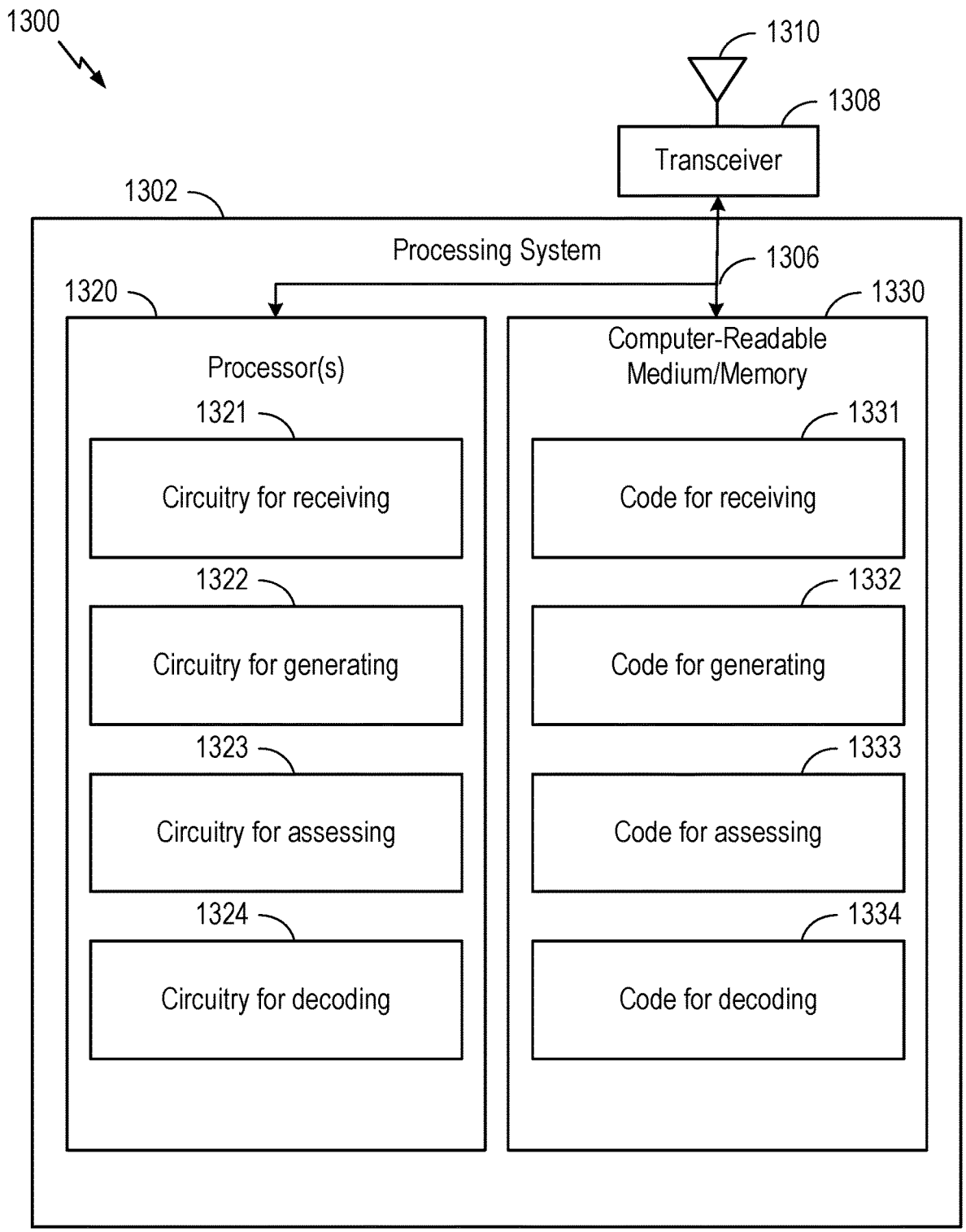
FIG. 13 depicts aspects of an example communications device.

FIG. 13 depicts an example communications device 1300 that includes various components operable, configured, or adapted to perform operations for the techniques disclosed herein, such as the operations depicted and described with respect to FIG. 12. In some examples, communications device 1300 may be a base station 102 as described, for example with respect to FIGS. 1 and 2.

Communications device 1300 includes a processing system 1302 coupled to a transceiver 1308 (e.g., a transmitter and/or a receiver). Transceiver 1308 is configured to transmit (or send) and receive signals for the communications device 1300 via an antenna 1310, such as the various signals as described herein. Processing system 1302 may be configured to perform processing functions for communications device 1300, including processing signals received and/or to be transmitted by communications device 1300.

Processing system 1302 includes one or more processors 1320 coupled to a computer-readable medium/memory 1330 via a bus 1306. In certain aspects, computer-readable medium/memory 1330 is configured to store instructions (e.g., computer-executable code) that when executed by the one or more processors 1320, cause the one or more processors 1320 to perform the operations illustrated in FIG. 12, or other operations for performing the various techniques discussed herein to perform decompression of measurement results using a neural network model.

In the depicted example, computer-readable medium/memory 1330 stores code 1331 for receiving, code 1332 for generating, code 1333 for assessing, and code 1334 for decoding.

In the depicted example, the one or more processors 1320 include circuitry configured to implement the code stored in the computer-readable medium/memory 1330, including circuitry 1321 for receiving, circuitry 1322 for generating, circuitry 1323 for assessing, and circuitry 1324 for decoding (e.g., decoder 420, 422, 424, 426, or 428).

Various components of communications device 1300 may provide means for performing the methods described herein, including with respect to FIG. 12.

In some examples, means for transmitting or sending (or means for outputting for transmission) may include the transceivers 232 and/or antenna(s) 234 of the base station 102 illustrated in FIG. 2 and/or transceiver 1308 and antenna 1310 of the communications device 1300 in FIG. 13.

In some examples, means for receiving (or means for obtaining) may include the transceivers 232 and/or antenna(s) 234 of the base station illustrated in FIG. 2 and/or transceiver 1308 and antenna 1310 of the communications device 1300 in FIG. 13.

In some examples, means for receiving, means for generating, means for assessing, and/or means for decoding may include various processing system components, such as the one or more processors 1320 in FIG. 13, or aspects of the base station 102 depicted in FIG. 2, including receive processor 238, transmit processor 220, TX MIMO processor 230, and/or controller/processor 240 (including a decoding component 241).

Notably, FIG. 13 is just one example, and many other examples and configurations of communications device 1300 are possible.

Figure 14:
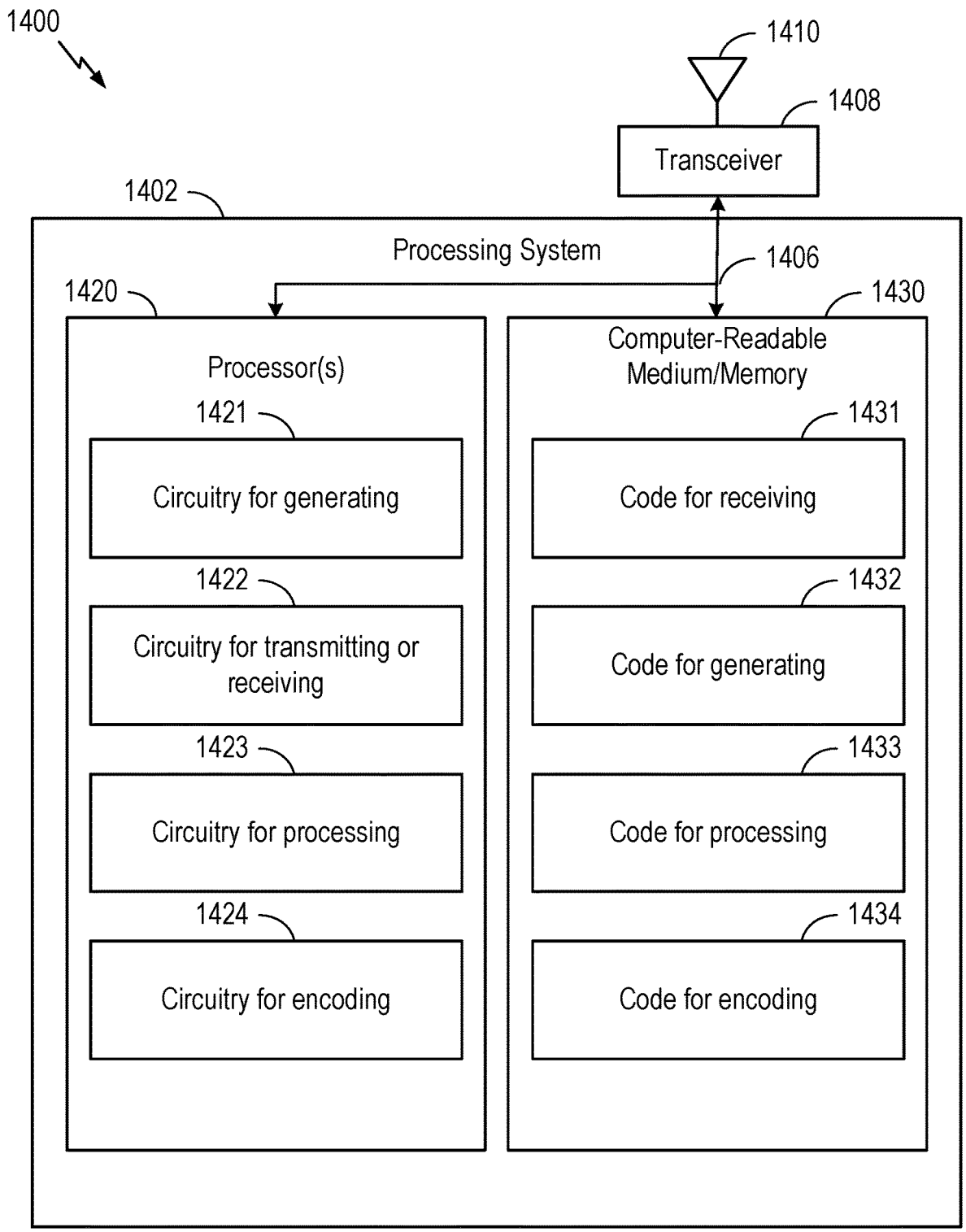
FIG. 14 depicts aspects of an example communications device.

FIG. 14 depicts an example communications device 1400 that includes various components operable, configured, or adapted to perform operations for the techniques disclosed herein, such as the operations depicted and described with respect to FIG. 11. In some examples, communications device 1400 may be a user equipment 104 as described, for example with respect to FIGS. 1 and 2.

Communications device 1400 includes a processing system 1402 coupled to a transceiver 1408 (e.g., a transmitter and/or a receiver). Transceiver 1408 is configured to transmit (or send) and receive signals for the communications device 1400 via an antenna 1410, such as the various signals as described herein. Processing system 1402 may be configured to perform processing functions for communications device 1400, including processing signals received and/or to be transmitted by communications device 1400.

Processing system 1402 includes one or more processors 1420 coupled to a computer-readable medium/memory 1430 via a bus 1406. In certain aspects, computer-readable medium/memory 1430 is configured to store instructions (e.g., computer-executable code) that when executed by the one or more processors 1420, cause the one or more processors 1420 to perform the operations illustrated in FIG. 11, or other operations for performing the various techniques discussed herein to perform encoding of measurements using a neural network model.

In the depicted example, computer-readable medium/memory 1430 stores code 1431 for generating, code 1432 for transmitting or receiving, code 1433 for processing, and code 1434 for encoding.

In the depicted example, the one or more processors 1420 include circuitry configured to implement the code stored in the computer-readable medium/memory 1430, including circuitry 1421 for generating, circuitry 1422 for transmitting and/or receiving, circuitry 1423 for processing, and circuitry 1424 for encoding (e.g., encoder 402, 404, 406, 408, or 410).

Various components of communications device 1400 may provide means for performing the methods described herein, including with respect to FIG. 11.

In some examples, means for transmitting or sending (or means for outputting for transmission) may include the transceivers 254 and/or antenna(s) 252 of the user equipment 104 illustrated in FIG. 2 and/or transceiver 1408 and antenna 1410 of the communications device 1400 in FIG. 14.

In some examples, means for receiving (or means for obtaining) may include the transceivers 254 and/or antenna(s) 252 of the user equipment 104 illustrated in FIG.

2 and/or transceiver 1408 and antenna 1410 of the communications device 1400 in FIG. 14.

In some examples, means for generating, means for transmitting or receiving, means for processing, and/or means for encoding may include various processing system components, such as the one or more processors 1420 in FIG. 14, or aspects of the user equipment 104 depicted in FIG. 2, including receive processor 258, transmit processor 264, TX MIMO processor 266, and/or controller/processor 280 (including an encoding component 281).

Notably, FIG. 14 is just one example, and many other examples and configurations of communications device 1400 are possible.

EXAMPLE CLAUSES

Implementation examples are described in the following numbered clauses:

Clause 1. A method for wireless communication, comprising: generating, via each of a plurality of neural network encoders operating on measurement data, a compressed measurement based on a respective portion of the measurement data, wherein each of the neural network encoders is based on the same neural network model; generating at least one message indicative of the measurement data based on the compressed measurements; and transmitting the at least one message.

Clause 2. The method of clause 1, wherein the measurement data is generated using measurements performed for a bandwidth, and wherein the portion of the measurement data is associated with a subband of the bandwidth.

Clause 3. The method of any one of clauses 1-2, wherein: the compressed measurements comprise a first compressed measurement and a second compressed measurement; the method further comprises generating a first differential measurement to represent the second compressed measurement, the first differential measurement being generated based on a difference between the first compressed measurement and the second compressed measurement; and the at least one message is generated based on the first compressed measurement and the first differential measurement.

Clause 4. The method of clause 3, wherein the first compressed measurement and the second compressed measurement are generated based on measurements performed on different subbands.

Clause 5. The method of any one of clauses 3-4, wherein the first compressed measurement and the second compressed measurement are generated based on measurements performed at different intervals.

Clause 6. The method of clause 5, wherein: the compressed measurements further include a third compressed measurement; the method further comprises generating a second differential measurement to represent the third compressed measurement, the second differential measurement being generated based on a difference between the first compressed measurement and the third compressed measurement; the first compressed measurement and the third compressed measurement are generated based on measurements performed on different subbands; and the at least one message is generated based on the first compressed measurement, the first differential measurement, and the second differential measurement.

Clause 7. The method of clause 6, wherein: the compressed measurements further include a fourth compressed measurement; the method further comprises generating a third differential measurement for the fourth compressed measurement, the third differential measurement being generated as a function of the first differential measurement and the second differential measurement; and the at least one message is generated based on the first compressed measurement, the first differential measurement, the second differential measurement, and the third differential measurement.

Clause 8. The method of clause 7, further comprising receiving an indication of the function.

Clause 9. The method of any one of clauses 3-8, wherein: the compressed measurements further include a third compressed measurement; the method further comprises generating a second differential measurement for the third compressed measurement, the second differential measurement being generated based on a difference between the first compressed measurement and the third compressed measurement; and the at least one message is generated based on the first compressed measurement, the first differential measurement, and the second differential measurement.

Clause 10. The method of any one of clauses 3-9, wherein: the compressed measurements further include a third compressed measurement; the method further comprises generating a second differential measurement for the third compressed measurement, the second differential measurement being generated based on a difference between the second compressed measurement and the third compressed measurement; and the at least one message is generated based on the first compressed measurement, the first differential measurement, and the second differential measurement.

Clause 11. The method of any one of clauses 3-10, further comprising: quantizing the first compressed measurement using a first granularity; and quantizing the first differential measurement using a second granularity, the second granularity being coarser than the first granularity.

Clause 12. The method of clause 11, further comprising receiving an indication of the first granularity and the second granularity.

Clause 13. The method of any one of clauses 1-12, further comprising receiving an indication of whether to perform differential encoding of the compressed measurement.

Clause 14. The method of any one of clauses 1-13, further comprising receiving an indication of whether to perform differential encoding of the compressed measurements across measurements in at least one of the time domain or the frequency domain.

Clause 15. The method of any one of clauses 1-14, further comprising processing the compressed measurements via another neural network model to generate further compressed measurements, wherein the at least one message indicates the further compressed measurements.

Clause 16. A method for wireless communication, comprising: receiving at least one message indicating compressed measurement data; generating, via each of a plurality of neural network decoders operating on the compressed measurement data, a decompressed measurement based on a respective portion of the compressed measurement data, wherein each of the neural network decoders is based on the same neural network model; and assessing channel characteristics based on the decompressed measurements.

Clause 17. The method of clause 16, wherein the compressed measurement data is associated with measurements performed for a bandwidth, and wherein the portion of the compressed measurement data is associated with a subband of the bandwidth.

Clause 18. The method of any one of clauses 16-17, wherein: the compressed measurement data comprise a first compressed measurement data and a second compressed measurement data; the method further comprises generating a first summation measurement, the first summation measurement being generated based on a sum of the first compressed measurement data and the second compressed measurement data; and the decompressed measurement is generated based on the first compressed measurement data and the first summation measurement.

Clause 19. The method of clause 18, wherein the first compressed measurement data and the second compressed measurement data are associated with measurements performed on different subbands.

Clause 20. The method of any one of clauses 18-19, wherein the first compressed measurement data and the second compressed measurement data are associated with measurements performed at different intervals.

Clause 21. The method of clause 20, wherein: the compressed measurement data further include a third compressed measurement data; the method further comprises generating a second summation measurement, the second summation measurement being generated based on a sum of the first compressed measurement data and the third compressed measurement data; the first compressed measurement data and the third compressed measurement data are associated with measurements performed on different subbands; and the decompressed measurement is generated based on the first compressed measurement data, the first summation measurement, and the second summation measurement.

Clause 22. The method of clause 21, wherein: the compressed measurement data further include a fourth compressed measurement data; the method further comprises generating a third summation measurement, the third summation measurement being generated as a function of the first summation measurement and the second summation measurement; and the decompressed measurement is generated based on the first compressed measurement data, the first summation measurement, the second summation measurement, and the third summation measurement.

Clause 23. The method of clause 22, further comprising transmitting an indication of the function.

Clause 24. The method of any one of clauses 18-23, wherein: the compressed measurement data further include a third compressed measurement data; the method further comprises generating a second summation measurement, the second summation measurement being generated based on a sum of the first compressed measurement data and the third compressed measurement data; and the decompressed measurement is generated based on the first compressed measurement data, the first summation measurement, and the second summation measurement.

Clause 25. The method of any one of clauses 18-24, wherein: the compressed measurement data further include a third compressed measurement data; the method further comprises generating a second summation measurement, the second summation measurement being generated based on a sum of the second compressed measurement data and the third compressed measurement data; and the decompressed measurement is generated based on the first compressed measurement data, the first summation measurement, and the second summation measurement.

Clause 26. The method of any one of clauses 18-25, further comprising transmitting an indication of a first quantization granularity for generating the first compressed measurement data and a second quantization granularity for generating the second compressed measurement data.

Clause 27. The method of clause 16, further comprising transmitting an indication of whether to perform differential encoding for generation of the compressed measurement data.

Clause 28. The method of any one of clauses 16-27, further comprising transmitting an indication of whether to perform differential encoding for generation of the compressed measurement data across measurements in at least one of the time domain or the frequency domain.

Clause 29. The method of any one of clauses 16-28, wherein the at least one message indicates a further compressed measurement data, the method further comprising processing the further compressed measurement data via another neural network model to generate the compressed measurement data.

Clause 30: An apparatus, comprising: a memory comprising executable instructions; one or more processors configured to execute the executable instructions and cause the apparatus to perform a method in accordance with any one of Clauses 1-29.

Clause 31: An apparatus, comprising means for performing a method in accordance with any one of Clauses 1-29.

Clause 32: A non-transitory computer-readable medium comprising executable instructions that, when executed by one or more processors of an apparatus, cause the apparatus to perform a method in accordance with any one of Clauses 1-29.

Clause 33: A computer program product embodied on a computer-readable storage medium comprising code for performing a method in accordance with any one of Clauses 1-29.

Additional Wireless Communication Network Considerations

The techniques and methods described herein may be used for various wireless communications networks (or wireless wide area network (WWAN)) and radio access technologies (RATs). While aspects may be described herein using terminology commonly associated with 3G, 4G, and/or 5G (e.g., 5G new radio (NR)) wireless technologies, aspects of the present disclosure may likewise be applicable to other communication systems and standards not explicitly mentioned herein.

5G wireless communication networks may support various advanced wireless communication services, such as enhanced mobile broadband (eMBB), millimeter wave (mmWave), machine type communications (MTC), and/or mission critical targeting ultra-reliable, low-latency communications (URLLC). These services, and others, may include latency and reliability specifications.

Returning to FIG. 1, various aspects of the present disclosure may be performed within the example wireless communication network 100.

In 3GPP, the term "cell" can refer to a coverage area of a NodeB and/or a narrowband subsystem serving this coverage area, depending on the context in which the term is used. In NR systems, the term "cell" and BS, next generation NodeB (gNB or gNodeB), access point (AP), distributed unit (DU), carrier, or transmission reception point may be used interchangeably. A BS may provide communication coverage for a macro cell, a pico cell, a femto cell, and/or other types of cells.

A macro cell may generally cover a relatively large geographic area (e.g., several kilometers in radius) and may allow unrestricted access by UEs with service subscription. A pico cell may cover a relatively small geographic area (e.g., a sports stadium) and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG) and UEs for users in the home). A BS for a macro cell may be referred to as a macro BS. A BS for a pico cell may be referred to as a pico BS. A BS for a femto cell may be referred to as a femto BS, home BS, or a home NodeB.

Base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). Base stations 102 configured for 5G (e.g., 5G NR or Next Generation RAN (NG-RAN)) may interface with 5GC 190 through second backhaul links 184. Base stations 102 may communicate directly or indirectly (e.g., through the EPC 160 or 5GC 190) with each other over third backhaul links 134 (e.g., X2 interface). Third backhaul links 134 may generally be wired or wireless.

Small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. Small cell 102', employing NR in an unlicensed frequency spectrum, may boost coverage to and/or increase capacity of the access network.

Some base stations, such as a gNB may operate in a traditional sub-6 GHz spectrum, in millimeter wave (mmWave) frequencies, and/or near mmWave frequencies in communication with the UE 104. When the gNB operates in mmWave or near mmWave frequencies, the gNB may be referred to as a mmWave base station.

The communication links 120 between base stations 102 and, for example, UEs 104, may be through one or more carriers. For example, base stations 102 and UEs 104 may use spectrum up to Y MHz (e.g., 5, 10, 15, 20, 100, 400, and other MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell), and a secondary component carrier may be referred to as a secondary cell (SCell).

Wireless communications network 100 further includes a Wi-Fi access point (AP) 150 in communication with Wi-Fi stations (STAs) 152 via communication links 154 in, for example, a 2.4 GHz and/or 5 GHz unlicensed frequency spectrum. When communicating in an unlicensed frequency spectrum, the STAs 152 and AP 150 may perform a clear channel assessment (CCA) prior to communicating in order to determine whether the channel is available.

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, 4G (e.g., LTE), or 5G (e.g., NR), to name a few options.

EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to the IP Services 176, which may include, for example, the Internet, an intranet, an IP Multimedia Subsystem (IMS), a PS Streaming Service, and/or other IP services.

BM-SC 170 may provide functions for MBMS user service provisioning and delivery. BM-SC 170 may serve as an entry point for content provider MBMS transmission, may be used to authorize and initiate MBMS bearer services within a public land mobile network (PLMN), and may be used to schedule MBMS transmissions. MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS-related charging information.

5GC 190 may include an Access and Mobility Management Function (AMF) 192, other AMFs 193, a Session Management Function (SMF) 194, and a User Plane Function (UPF) 195. AMF 192 may be in communication with a Unified Data Management (UDM) 196.

AMF 192 is generally the control node that processes the signaling between UEs 104 and 5GC 190. Generally, AMF 192 provides QoS flow and session management.

All user Internet protocol (IP) packets are transferred through UPF 195, which is connected to the IP Services 197, and which provides UE IP address allocation as well as other functions for 5GC 190. IP Services 197 may include, for example, the Internet, an intranet, an IP Multimedia Subsystem (IMS), a PS Streaming Service, and/or other IP services.

Returning to FIG. 2, various example components of BS 102 and UE 104 (e.g., the wireless communication network 100 of FIG. 1) are depicted, which may be used to implement aspects of the present disclosure.

At BS 102, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), and others. The data may be for the physical downlink shared channel (PDSCH), in some examples.

A medium access control (MAC)-control element (MAC-CE) is a MAC layer communication structure that may be used for control command exchange between wireless nodes. The MAC-CE may be carried in a shared channel such as a physical downlink shared channel (PDSCH), a physical uplink shared channel (PUSCH), or a physical sidelink shared channel (PSSCH).

Processor 220 may process (e.g., encode and symbol map) the data and control information to obtain data symbols and control symbols, respectively. Transmit processor 220 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for OFDM) to obtain an output sample stream. Each modulator may further process (e.g., convert to analog, amplify, filter, and upconvert) the output sample stream to obtain a downlink signal. Downlink signals from the modulators in transceivers 232a-232t may be transmitted via the antennas 234a-234t, respectively.

At UE 104, antennas 252a-252r may receive the downlink signals from the BS 102 and may provide received signals to the demodulators (DEMODs) in transceivers 254a-254r, respectively. Each demodulator in transceivers 254a-254r may condition (e.g., filter, amplify, downconvert, and digitize) a respective received signal to obtain input samples. Each demodulator may further process the input samples (e.g., for OFDM) to obtain received symbols.

MIMO detector 256 may obtain received symbols from all the demodulators in transceivers 254a-254r, perform MIMO detection on the received symbols if applicable, and provide detected symbols. Receive processor 258 may process (e.g., demodulate, deinterleave, and decode) the detected symbols, provide decoded data for the UE 104 to a data sink 260, and provide decoded control information to a controller/processor 280.

On the uplink, at UE 104, transmit processor 264 may receive and process data (e.g., for the physical uplink shared channel (PUSCH)) from a data source 262 and control information (e.g., for the physical uplink control channel (PUCCH)) from the controller/processor 280. Transmit processor 264 may also generate reference symbols for a reference signal (e.g., for the sounding reference signal (SRS)). The symbols from the transmit processor 264 may be precoded by a TX MIMO processor 266 if applicable, further processed by the modulators in transceivers 254a-254r (e.g., for SC-FDM), and transmitted to BS 102.

At BS 102, the uplink signals from UE 104 may be received by antennas 234a-t, processed by the demodulators in transceivers 232a-232t, detected by a MIMO detector 236 if applicable, and further processed by a receive processor 238 to obtain decoded data and control information sent by UE 104. Receive processor 238 may provide the decoded data to a data sink 239 and the decoded control information to the controller/processor 240.

Memories 242 and 282 may store data and program codes for BS 102 and UE 104, respectively.

Scheduler 244 may schedule UEs for data transmission on the downlink and/or uplink.

5G may utilize orthogonal frequency division multiplexing (OFDM) with a cyclic prefix (CP) on the uplink and downlink. 5G may also support half-duplex operation using time division duplexing (TDD). OFDM and single-carrier frequency division multiplexing (SC-FDM) partition the system bandwidth into multiple orthogonal subcarriers, which are also commonly referred to as tones and bins. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The minimum resource allocation, called a resource block (RB), may be 12 consecutive subcarriers in some examples. The system bandwidth may also be partitioned into subbands. For example, a subband may cover multiple RBs. NR may support a base subcarrier spacing (SCS) of 15 kHz, and other SCS may be defined with respect to the base SCS (e.g., 30 kHz, 60 kHz, 120 kHz, 240 kHz, and others).

As above, FIGS. 3A-3D depict various example aspects of data structures for a wireless communication network, such as wireless communication network 100 of FIG. 1.

In various aspects, the 5G frame structure may be frequency division duplex (FDD), in which for a particular set of subcarriers (carrier system bandwidth), subframes within the set of subcarriers are dedicated for either DL or UL. 5G frame structures may also be time division duplex (TDD), in which for a particular set of subcarriers (carrier system bandwidth), subframes within the set of subcarriers are dedicated for both DL and UL. In the examples provided by FIGS. 3A and 3C, the 5G frame structure is assumed to be TDD, with subframe 4 being configured with slot format 28 (with mostly DL), where D is DL, U is UL, and X is flexible for use between DL/UL, and with subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description below applies also to a 5G frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. In some examples, each slot may include 7 or 14 symbols, depending on the slot configuration.

For example, for slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission).

The number of slots within a subframe is based on the slot configuration and the numerology. For slot configuration 0, different numerologies 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology $\mu$, there are 14 symbols/slot and $2\mu$ slots/subframe. The subcarrier spacing and symbol length/duration are a function of the numerology. The subcarrier spacing may be equal to $2^\mu \times 15$ kHz, where $\mu$ is the numerology 0 to 5. As such, the numerology $\mu=0$ has a subcarrier spacing of 15 kHz, and the numerology $\mu=5$ has a subcarrier spacing of 480 kHz. The symbol length/duration is inversely related to the subcarrier spacing. FIGS. 3A-3D provide an example of slot configuration 0 with 14 symbols per slot and numerology $\mu=2$ with 4 slots per subframe. The slot duration is 0.25 ms, the subcarrier spacing is 60 kHz, and the symbol duration is approximately 16.67 μs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 3A, some of the REs carry reference (pilot) signals (RS) for a UE (e.g., UE 104 of FIGS. 1 and 2). The RS may include demodulation RS (DM-RS) (indicated as Rx for one particular configuration, where 100× is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 3B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol.

A primary synchronization signal (PSS) may be within symbol 2 of particular subframes of a frame. The PSS is used by a UE (e.g., 104 of FIGS. 1 and 2) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 3C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 3D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

ADDITIONAL CONSIDERATIONS

The preceding description provides examples of measurement encoding and decoding in communication systems. The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The techniques described herein may be used for various wireless communication technologies, such as 5G (e.g., 5G NR), 3GPP Long Term Evolution (LTE), LTE-Advanced (LTE-A), code division multiple access (CDMA), time division multiple access (TDMA), frequency division multiple access (FDMA), orthogonal frequency division multiple access (OFDMA), single-carrier frequency division multiple access (SC-FDMA), time division synchronous code division multiple access (TD-SCDMA), and other networks. The terms "network" and "system" are often used interchangeably. A CDMA network may implement a radio technology such as Universal Terrestrial Radio Access (UTRA), cdma2000, and others. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g., 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, and others. UTRA and E-UTRA are part of Universal Mobile Telecommunication System (UMTS). LTE and LTE-A are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). NR is an emerging wireless communications technology under development.

The various illustrative logical blocks, modules, and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user equipment (see FIG. 1), a user interface (e.g., keypad, display, mouse, joystick, touchscreen, biometric sensor, proximity sensor, light-emitting element, and others) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer-readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus, comprising:
a memory having executable instructions; and
one or more processors configured to execute the executable instructions and cause the apparatus to:
generate, via each of a plurality of neural network encoders operating on measurement data, a compressed measurement based on a respective portion of the measurement data, wherein each of the neural network encoders is based on the same neural network model, wherein the measurement data is generated using measurements performed for a bandwidth, and wherein the portion of the measurement data is associated with a subband of the bandwidth;
generate at least one message indicative of the measurement data based on the compressed measurements; and
transmit the at least one message.

2. The apparatus of claim 1, wherein the one or more processors are further configured to cause the apparatus to process the compressed measurements via another neural network model to generate further compressed measurements, wherein the at least one message indicates the further compressed measurements.

3. The apparatus of claim 1, wherein:
the compressed measurements comprise a first compressed measurement and a second compressed measurement;
the one or more processors are further configured to cause the apparatus to generate a first differential measurement to represent the second compressed measurement, the first differential measurement being generated based on a difference between the first compressed measurement and the second compressed measurement; and
the at least one message is generated based on the first compressed measurement and the first differential measurement.

4. The apparatus of claim 3, wherein the first compressed measurement and the second compressed measurement are generated based on measurements performed on different subbands.

5. The apparatus of claim 3, wherein the first compressed measurement and the second compressed measurement are generated based on measurements performed at different intervals.

6. The apparatus of claim 5, wherein:
the compressed measurements further include a third compressed measurement;
the one or more processors are further configured to cause the apparatus to generate a second differential measurement to represent the third compressed measurement, the second differential measurement being generated based on a difference between the first compressed measurement and the third compressed measurement;
the first compressed measurement and the third compressed measurement are generated based on measurements performed on different subbands; and
the at least one message is generated based on the first compressed measurement, the first differential measurement, and the second differential measurement.

7. The apparatus of claim 6, wherein:
the compressed measurements further include a fourth compressed measurement;
the one or more processors are further configured to cause the apparatus to generate a third differential measurement for the fourth compressed measurement, the third differential measurement being generated as a function of the first differential measurement and the second differential measurement; and
the at least one message is generated based on the first compressed measurement, the first differential measurement, the second differential measurement, and the third differential measurement.

8. The apparatus of claim 7, wherein the one or more processors are further configured to cause the apparatus to receive an indication of the function.

9. The apparatus of claim 3, wherein:
the compressed measurements further include a third compressed measurement;
the one or more processors are further configured to cause the apparatus to generate a second differential measurement for the third compressed measurement, the second differential measurement being generated based on a difference between the first compressed measurement and the third compressed measurement; and
the at least one message is generated based on the first compressed measurement, the first differential measurement, and the second differential measurement.

10. The apparatus of claim 3, wherein:
the compressed measurements further include a third compressed measurement;
the one or more processors are further configured to cause the apparatus to generate a second differential measurement for the third compressed measurement, the second differential measurement being generated based on a difference between the second compressed measurement and the third compressed measurement; and
the at least one message is generated based on the first compressed measurement, the first differential measurement, and the second differential measurement.

11. The apparatus of claim 3, wherein the one or more processors are further configured to cause the apparatus to quantize the first compressed measurement using a first granularity; and
quantize the first differential measurement using a second granularity, the second granularity being coarser than the first granularity.

12. The apparatus of claim 11, wherein the one or more processors are further configured to cause the apparatus to receive an indication of the first granularity and the second granularity.

13. The apparatus of claim 1, wherein the one or more processors are further configured to cause the apparatus to receive an indication of whether to perform differential encoding of the compressed measurement.

14. The apparatus of claim 1, wherein the one or more processors are further configured to cause the apparatus to receive an indication of whether to perform differential encoding of the compressed measurements across measurements in at least one of the time domain or the frequency domain.

15. An apparatus, comprising:
a memory having executable instructions; and
one or more processors configured to execute the executable instructions and cause the apparatus to:
receive at least one message indicating compressed measurement data;
generate, via each of a plurality of neural network decoders operating on the compressed measurement data, a decompressed measurement based on a respective portion of the compressed measurement data, wherein each of the neural network decoders is based on the same neural network model, wherein the compressed measurement data is associated with measurements performed for a bandwidth, and wherein the portion of the compressed measurement data is associated with a subband of the bandwidth; and
assess channel characteristics based on the decompressed measurements.

16. The apparatus of claim 15, wherein the one or more processors are further configured to cause the apparatus to transmit an indication of whether to perform differential encoding for generation of the compressed measurement data.

17. The apparatus of claim 15, wherein the one or more processors are further configured to cause the apparatus to transmit an indication of whether to perform differential encoding for generation of the compressed measurement data across measurements in at least one of the time domain or the frequency domain.

18. The apparatus of claim 15, wherein:
the compressed measurement data comprise a first compressed measurement data and a second compressed measurement data;
the one or more processors are further configured to cause the apparatus to generate a first summation measurement, the first summation measurement being generated based on a sum of the first compressed measurement data and the second compressed measurement data; and
the decompressed measurement is generated based on the first compressed measurement data and the first summation measurement.

19. The apparatus of claim 18, wherein the first compressed measurement data and the second compressed measurement data are associated with measurements performed on different subbands.

20. The apparatus of claim 18, wherein the first compressed measurement data and the second compressed measurement data are associated with measurements performed at different intervals.

21. The apparatus of claim 20, wherein:
the compressed measurement data further include a third compressed measurement data;
the one or more processors are further configured to cause the apparatus to generate a second summation measurement, the second summation measurement being generated based on a sum of the first compressed measurement data and the third compressed measurement data;
the first compressed measurement data and the third compressed measurement data are associated with measurements performed on different subbands; and
the decompressed measurement is generated based on the first compressed measurement data, the first summation measurement, and the second summation measurement.

22. The apparatus of claim 21, wherein:
the compressed measurement data further include a fourth compressed measurement data;
the one or more processors are further configured to cause the apparatus to generate a third summation measurement, the third summation measurement being generated as a function of the first summation measurement and the second summation measurement; and
the decompressed measurement is generated based on the first compressed measurement data, the first summation measurement, the second summation measurement, and the third summation measurement.

23. The apparatus of claim 22, wherein the one or more processors are further configured to cause the apparatus to transmit an indication of the function.

24. The apparatus of claim 18, wherein:
the compressed measurement data further include a third compressed measurement data;
the one or more processors are further configured to cause the apparatus to generate a second summation measurement, the second summation measurement being generated based on a sum of the first compressed measurement data and the third compressed measurement data; and
the decompressed measurement is generated based on the first compressed measurement data, the first summation measurement, and the second summation measurement.

25. The apparatus of claim 18, wherein:
the compressed measurement data further include a third compressed measurement data;
the one or more processors are further configured to cause the apparatus to generate a second summation measurement, the second summation measurement being generated based on a sum of the second compressed measurement data and the third compressed measurement data; and
the decompressed measurement is generated based on the first compressed measurement data, the first summation measurement, and the second summation measurement.

26. The apparatus of claim 18, wherein the one or more processors are further configured to cause the apparatus to transmit an indication of a first quantization granularity for generating the first compressed measurement data and a second quantization granularity for generating the second compressed measurement data.

27. A method for wireless communication, comprising:
generating, via each of a plurality of neural network encoders operating on measurement data, a compressed measurement based on a respective portion of the measurement data, wherein each of the neural network encoders is based on the same neural network model, wherein the measurement data is generated using measurements performed for a bandwidth, and wherein the portion of the measurement data is associated with a subband of the bandwidth;
generating at least one message indicative of the measurement data based on the compressed measurements; and
transmitting the at least one message.

28. A method for wireless communication, comprising:
receiving at least one message indicating compressed measurement data;
generating, via each of a plurality of neural network decoders operating on the compressed measurement data, a decompressed measurement based on a respective portion of the compressed measurement data, wherein each of the neural network decoders is based on the same neural network model, wherein the compressed measurement data is associated with measurements performed for a bandwidth, and wherein the portion of the compressed measurement data is associated with a subband of the bandwidth; and assessing channel characteristics based on the decompressed measurements.

* * * * *